United States Patent
Osinski et al.

(10) Patent No.: US 10,992,106 B1
(45) Date of Patent: Apr. 27, 2021

(54) METHOD FOR GENERATING SINGLE PICOSECOND OPTICAL PULSES WITH SUBSTANTIALLY SUPPRESSED TRANSIENT EMISSION TAIL IN SEMICONDUCTOR DIODE LASER

(71) Applicant: STC.UNM, Albuquerque, NM (US)

(72) Inventors: Marek Osinski, Albuquerque, NM (US); Gennady A. Smolyakov, Albuquerque, NM (US)

(73) Assignee: UNM Rainforest Innovations, Albuquerque, NM (US)

( * ) Notice: Subject to any disclaimer, the term of this patent is extended or adjusted under 35 U.S.C. 154(b) by 0 days.

(21) Appl. No.: 16/414,297

(22) Filed: May 16, 2019

Related U.S. Application Data

(60) Provisional application No. 62/672,216, filed on May 16, 2018.

(51) Int. Cl.
| | |
|---|---|
| *H01S 5/062* | (2006.01) |
| *H01S 5/06* | (2006.01) |
| *H01S 5/04* | (2006.01) |
| *H01S 5/10* | (2021.01) |
| *H01S 5/042* | (2006.01) |

(52) U.S. Cl.
CPC .......... *H01S 5/06216* (2013.01); *H01S 5/04* (2013.01); *H01S 5/041* (2013.01); *H01S 5/042* (2013.01); *H01S 5/06* (2013.01); *H01S 5/0608* (2013.01); *H01S 5/1071* (2013.01)

(58) Field of Classification Search
CPC .......... H01S 5/1071; H01S 5/04; H01S 5/041; H01S 5/042; H01S 5/06; H01S 5/0608; H01S 5/06216; H01S 5/065
See application file for complete search history.

(56) References Cited

U.S. PATENT DOCUMENTS

2016/0341664 A1* 11/2016 Rothberg ............... H05B 47/16

FOREIGN PATENT DOCUMENTS

WO      2017-200620 A2    11/2017

OTHER PUBLICATIONS

[Chen 1999] W. Chen, A. V. Rylyakov, V. Patel, J. E. Lukens, and K. K. Likharev, "Rapid single flux quantum T-flip flop operating up to 770 GHz", IEEE Trans. Appl. Supercond. 9 (#2), pp. 3212-3215, Jun. 1999.
[Mukhanov 2011] O. A. Mukhanov, "Energy-efficient single flux quantum technology", IEEE Trans. Appl. Supercond. 21 (#3), pp. 760-769, Jun. 2011.

* cited by examiner

*Primary Examiner* — Armando Rodriguez
(74) *Attorney, Agent, or Firm* — Keith Vogt, Ltd.; Keith A. Vogt

(57) ABSTRACT

A method for generating single optical pulses of picosecond-range duration with suppressed transient emission tails.

13 Claims, 29 Drawing Sheets

METHOD FOR GENERATING SINGLE PICOSECOND OPTICAL PULSES WITH SUBSTANTIALLY SUPPRESSED TRANSIENT EMISSION TAIL IN SEMICONDUCTOR DIODE LASER

RELATED APPLICATIONS

This application claims the benefit of U.S. Provisional Application No. 62/672,216 filed May 16, 2018 and herein incorporated by reference.

STATEMENT REGARDING FEDERALLY SPONSORED RESEARCH & DEVELOPMENT

This invention was made with government support under Grant No. N00014-15-1-2190 awarded by the Office of Naval Research. The government has certain rights in the invention.

INCORPORATION BY REFERENCE OF MATERIAL SUBMITTED ON A COMPACT DISC

Not applicable.

FIELD OF THE INVENTION

The present invention relates to semiconductor light-emitting laser devices. In particular, the invention relates to a method for generating single picosecond optical pulses with substantially suppressed transient emission tails in response to applying unipolar or bipolar injection-current pulses of picosecond duration to a semiconductor diode laser.

BACKGROUND OF THE INVENTION

High-speed low-power superconducting rapid single flux quantum (RSFQ) digital circuit technology offers significant advantages over the currently dominant CMOS digital technology (that consumes too much power) for a wide range of applications, ranging from digital radio frequency receivers to high performance computing. RSFQ circuits can operate at frequencies over 100 GHz (circuits operating up to 770 GHz have been demonstrated. Computers based on RSFQ however, have not been competitive due to lack of energy-efficient, high-bandwidth data links from cryogenic superconducting circuits to room-temperature semiconductor circuits. From the energy efficiency point of view, an optical data link would have an obvious advantage over all-electrical metal links in terms of much lower heat conductivity (negligible heat leak) and signal attenuation.

The RSFQ signal is a sequence of very short (~1 ps) pulses with a high repetition rate of over 100 GHz. Although WRLs are predicted to be quite responsive to such repetition rates, the optical output signal can be severely distorted due to transient behavior of the laser in response to 1 ps input pulses of injection current. This complication can make detection and interpretation of the transmitted data a very difficult problem to solve. For example, FIG. 1 and FIG. 2 show the calculated optical response of a 20-μm-diameter injection-locked WRL to a single 1-ps square current pulse of 1 mA amplitude. The figures represent two different biasing conditions of a single-frequency master laser and the WRL. In one situation of "high bias" (FIG. 1), the master laser is biased at 12 mA, two times above threshold, and the ring laser is biased at 6 mA, three times above threshold. In the second situation of "low bias" (FIG. 2), the master laser is at 7 mA, only 1 mA above the threshold, and the ring laser is at its threshold with 2 mA of injection current. In both cases, the ring laser is at 50 GHz positive frequency detuning relative to the master laser. As can be seen from the figures, the optical response is sensitive to the biasing conditions of the slave ring laser and to the optical injection level from the master laser. In either case, however, there is a pronounced ringing in the optical response that continues for almost 100 ps.

A need, therefore, exists for a method of controlling the slave laser output in order to generate single picosecond-range optical pulses with substantially suppressed transient emission tails in response to applying injection-current pulses of picosecond duration.

BRIEF SUMMARY OF THE INVENTION

In one embodiment, the present invention provides two approaches to the formation of an optical output of strongly injection-locked WRL in response to injection current excitation with multiple picosecond pulses. One or the other approach can be preferred depending on the master laser and WRL specific biasing conditions. The method described is applicable to any type of semiconductor diode laser, free-running or injection-locked, and can be used over a wide temperature range from 4 K to room temperature and above.

In other embodiments, the present invention provides a method for generating single optical pulses of picosecond-range duration with substantially suppressed transient emission tails in response to applying unipolar or bipolar injection-current pulses of picosecond-range duration to a semiconductor diode laser comprising: generating a sequence of picosecond-range unipolar or bipolar current pulses and applying the sequence of current pulses to a properly pre-biased semiconductor diode laser so that the first positive injection current pulse or the first several positive injection current pulses enable the semiconductor diode laser to generate a single optical output pulse, whereas the closing positive or negative current pulse substantially suppresses generation of a transient emission tail.

In other embodiments, the present invention provides a method wherein the second positive current pulse is applied after a relatively long time delay when the optical response to the first current pulse has started to decline after reaching its very first peak in the transient decay process, resulting in enhancement of the first intensity pulsation in terms of its duration (stretching of the optical pulse with no or little change in the amplitude) and substantially suppressed transient behavior.

In other embodiments, the present invention provides a method wherein the second positive current pulse is applied after a relatively short time delay before the optical response to the first current pulse has reached its very first peak in the transient decay process, allowing for significant build-up of carriers in the active region and resulting in enhancement of the first intensity pulsation in terms of its amplitude (amplification of the optical pulse with no or little change in its duration).

In other embodiments, the present invention provides a method wherein the amplitude of the closing positive or negative injection current pulse and its relative time delay are adjusted so as to ensure the most effective suppression of the transient emission tail.

In other embodiments, the present invention provides a method wherein the amplitude of the closing positive or negative injection current pulse and its relative time delay are adjusted so as to ensure the most effective suppression of the transient emission tail.

In other embodiments, the present invention provides a method wherein an additional pulse of a positive or negative polarity is applied.

In other embodiments, the present invention provides a method wherein the semiconductor diode laser is a ring diode laser.

In other embodiments, the present invention provides a method wherein the ring diode laser is a whistle-geometry ring diode laser.

In other embodiments, the present invention provides a method wherein the semiconductor diode laser is strongly injection-locked by a master semiconductor diode laser.

In other embodiments, the present invention provides a method wherein the semiconductor diode laser is a whistle-geometry ring diode laser and it is strongly injection-locked by a master semiconductor diode laser.

In other embodiments, the present invention provides a semiconductor diode laser that generates single picosecond-range optical pulses with substantially suppressed transient emission tails in response to applying unipolar or bipolar injection-current pulses of picosecond-range duration.

In other embodiments, the present invention provides a master semiconductor diode laser that controls the slave laser dynamics via optical injection in order to generate single picosecond-range optical pulses with substantially suppressed transient emission tails in response to applying injection-current pulses of picosecond-range duration applied to the slave ring laser.

In other embodiments, the present invention provides a master semiconductor diode laser that controls the slave ring laser dynamics via optical injection in order to generate single picosecond-range optical pulses with substantially suppressed transient emission tails, wherein both the master laser and the slave ring laser are biased above the threshold.

In other embodiments, the present invention provides a master semiconductor diode laser that controls the slave ring laser dynamics via optical injection in order to generate single picosecond-range optical pulses with substantially suppressed transient emission tails, wherein the master laser is biased above the threshold and the slave ring laser is biased at its threshold.

In other embodiments, the present invention provides an optical data link having at least a first and second current pulse, the second current pulse is applied when an optical response to the first current pulse has started to decline after reaching the first peak in the transient decay process.

In other embodiments, the present invention provides an optical data link of claim 16 wherein a third current pulse of positive or negative polarity with carefully adjusted amplitude is applied.

In other embodiments, the present invention provides an optical data link having at least a first and second current pulse, the second current pulse is applied after a relatively short time delay before the optical response to the first current pulse has reached a peak in the transient decay process.

In other embodiments, the present invention provides an optical data link wherein a third current pulse of positive or negative polarity with carefully adjusted amplitude is applied.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings illustrate generally, by way of example, but not by way of limitation, a detailed description of certain embodiments discussed in the present document.

DETAILED DESCRIPTION OF THE INVENTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method structure or system. Further, the terms and phrases used herein are not intended to be limiting, but rather to provide an understandable description of the invention.

The embodiments of the present invention are based upon a study of strongly injection-locked WRL responses to injection current input pulses (a single SFQ pulse or a sequence of pulses generated by a semiconductor output amplifier, with the time interval between the pulses considered as a system design parameter) of 1 ps duration in order to determine the optimum operation conditions allowing for adequate response from the WRL to very short current pulses. For the two bias conditions, optical injection levels, and frequency detuning (positive 50 GHz detuning) specified above, parameters of the injection current pulsed excitation (pulse amplitude, pulse polarity, the number of 1-ps pulses, their time separation, and the repetition rate) were determined for maximum improvement of dynamic response of strongly injection-locked WRL in terms of minimizing distortion of the output optical signal.

Depending on the time interval between the first current pulse and the second current pulse (or time delay for the second current pulse relative to the first current pulse), we have developed two approaches to control the optical output signal. In each case, the value of time delay for applying the second current pulse is determined from the analysis of the optical transient response to a single 1-ps current pulse under certain biasing conditions.

Figure 1A:
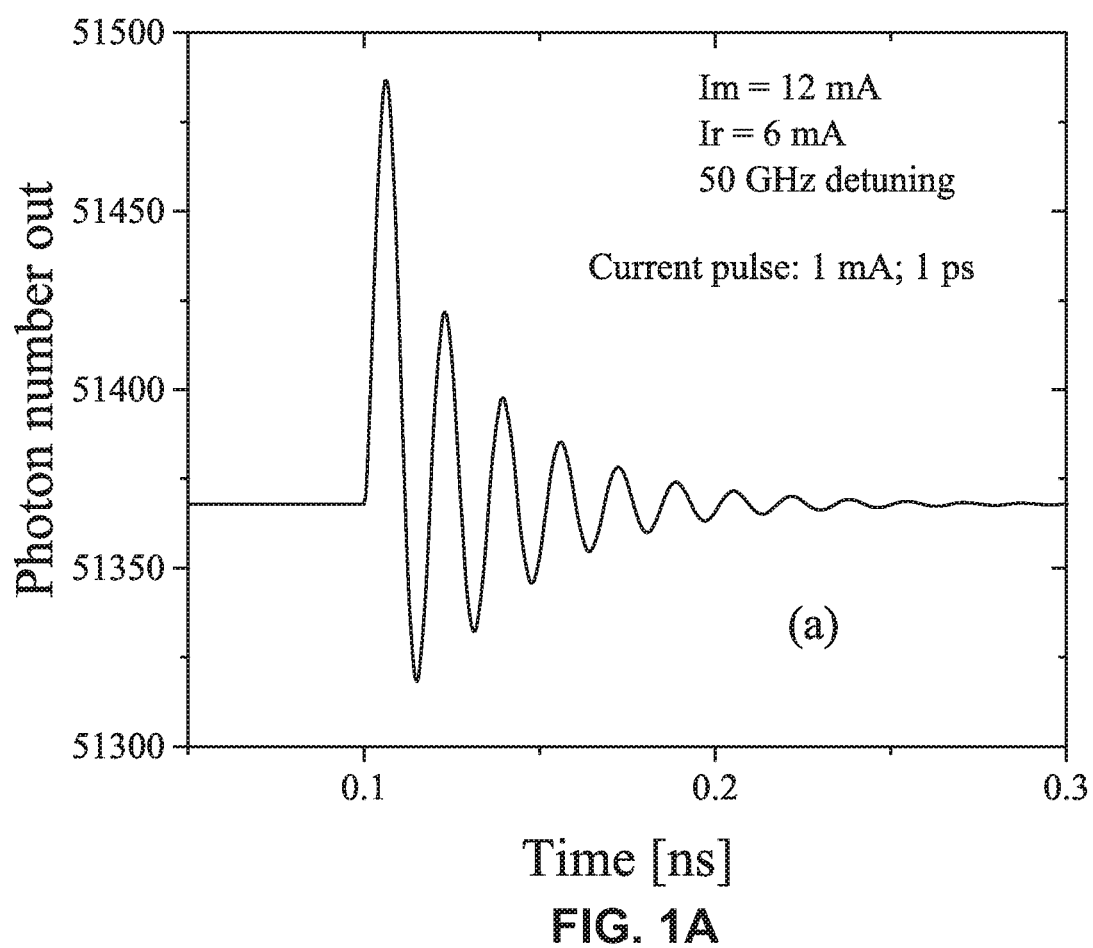
FIG. 1A shows an optical response of an injection-locked WRL to a single 1-ps square injection current pulse of 1 mA amplitude having a master laser biased at 12 mA and a ring laser biased at 6 mA.
Figure 1B:
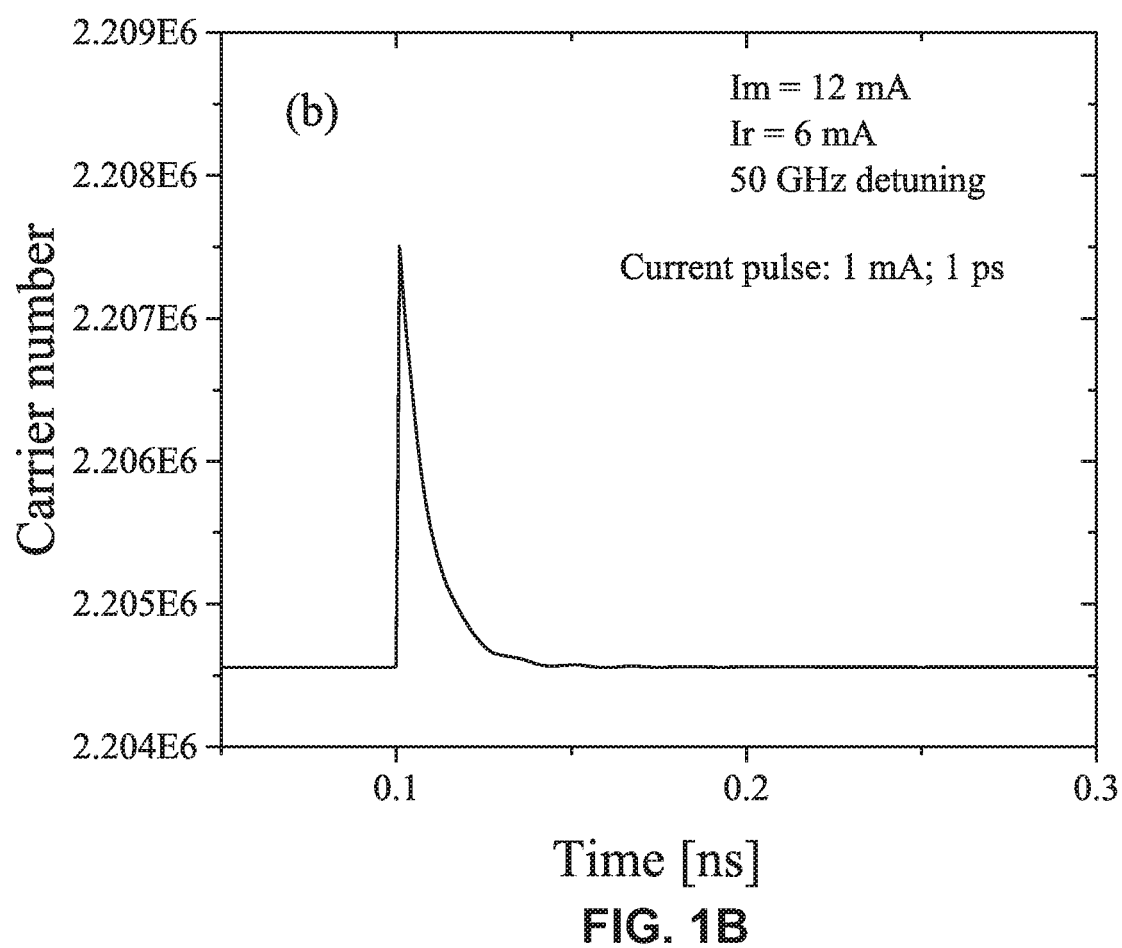
FIG. 1B shows the injected carrier dynamics of an injection-locked WRL to a single 1-ps square injection current pulse of 1 mA amplitude having a master laser biased at 12 mA and a ring laser biased at 6 mA.
Figure 2A:
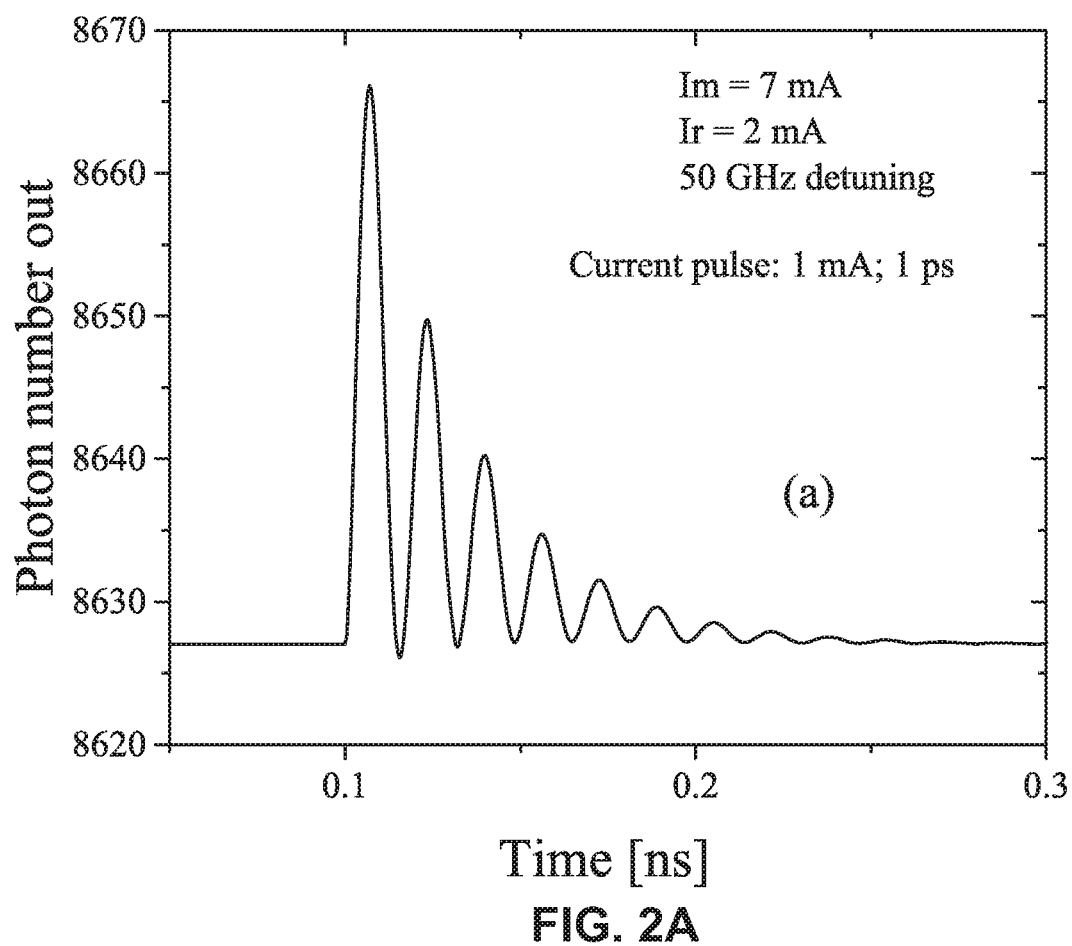
FIG. 2A shows an optical response of an injection-locked WRL to a single 1-ps square injection current pulse of 1 mA amplitude having a master laser biased at 7 mA and a ring laser biased at 2 mA.
Figure 2B:
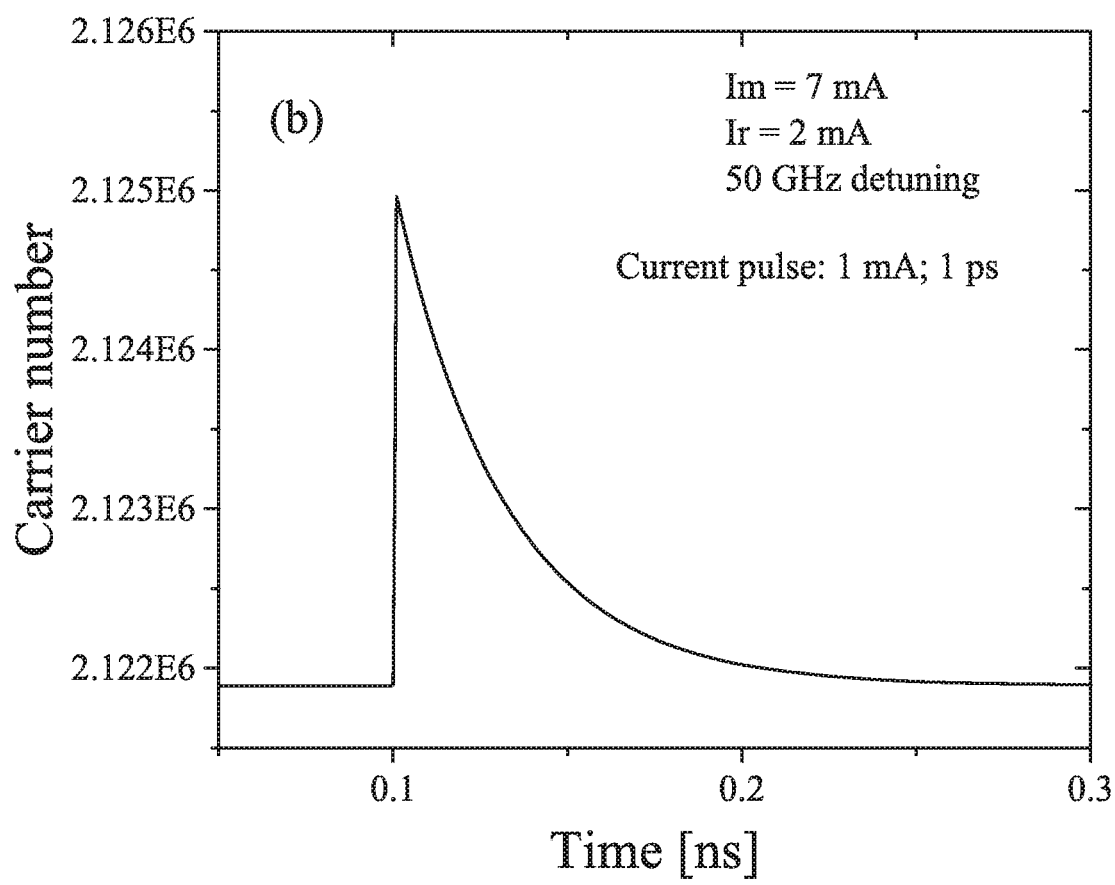
FIG. 2B shows the injected carrier dynamic of an injection-locked WRL to a single 1-ps square injection current pulse of 1 mA amplitude having a master laser biased at 7 mA and a ring laser biased at 2 mA.
Figure 3A:
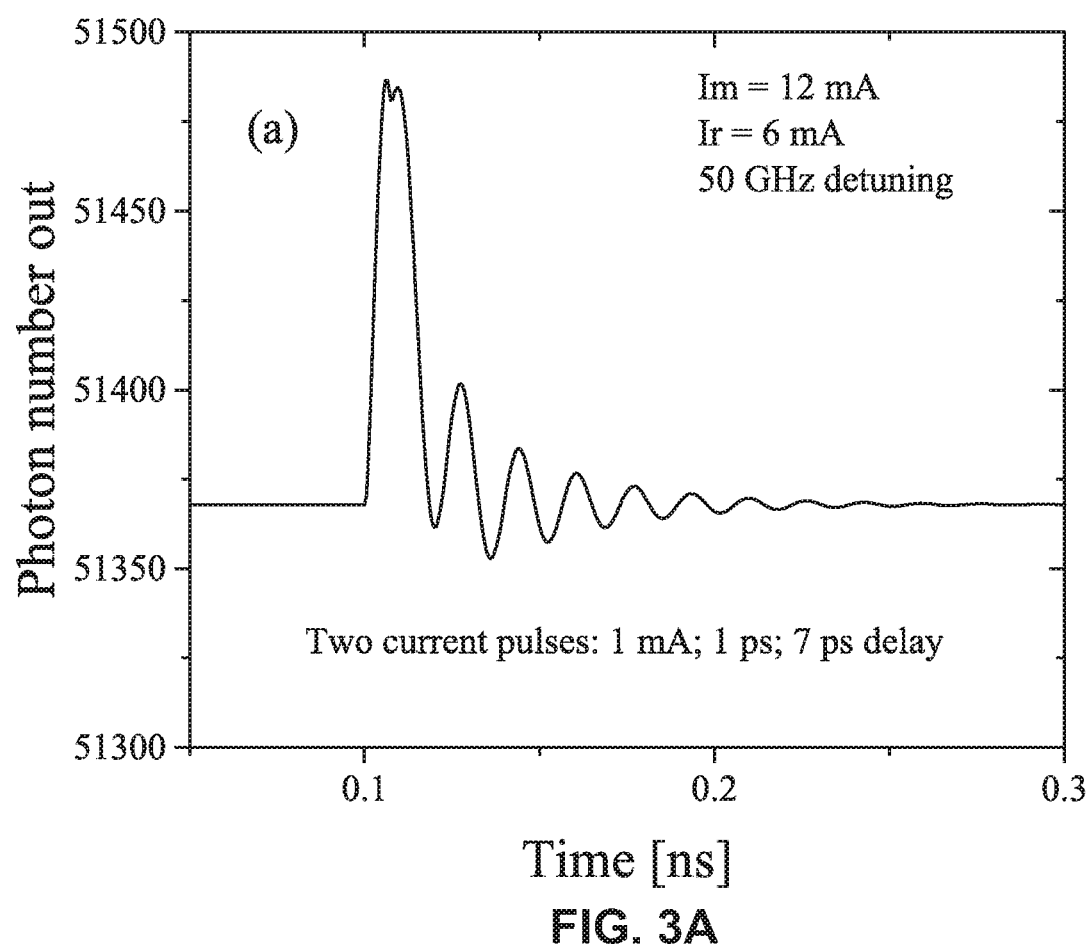
FIG. 3A shows the optical response of an injection-locked WRL to two sequential square 1-ps injection current pulses of 1 mA amplitude having a master laser biased at 12 mA and a ring laser biased at 6 mA with the time delay for the second pulse being 7 ps.
Figure 3B:
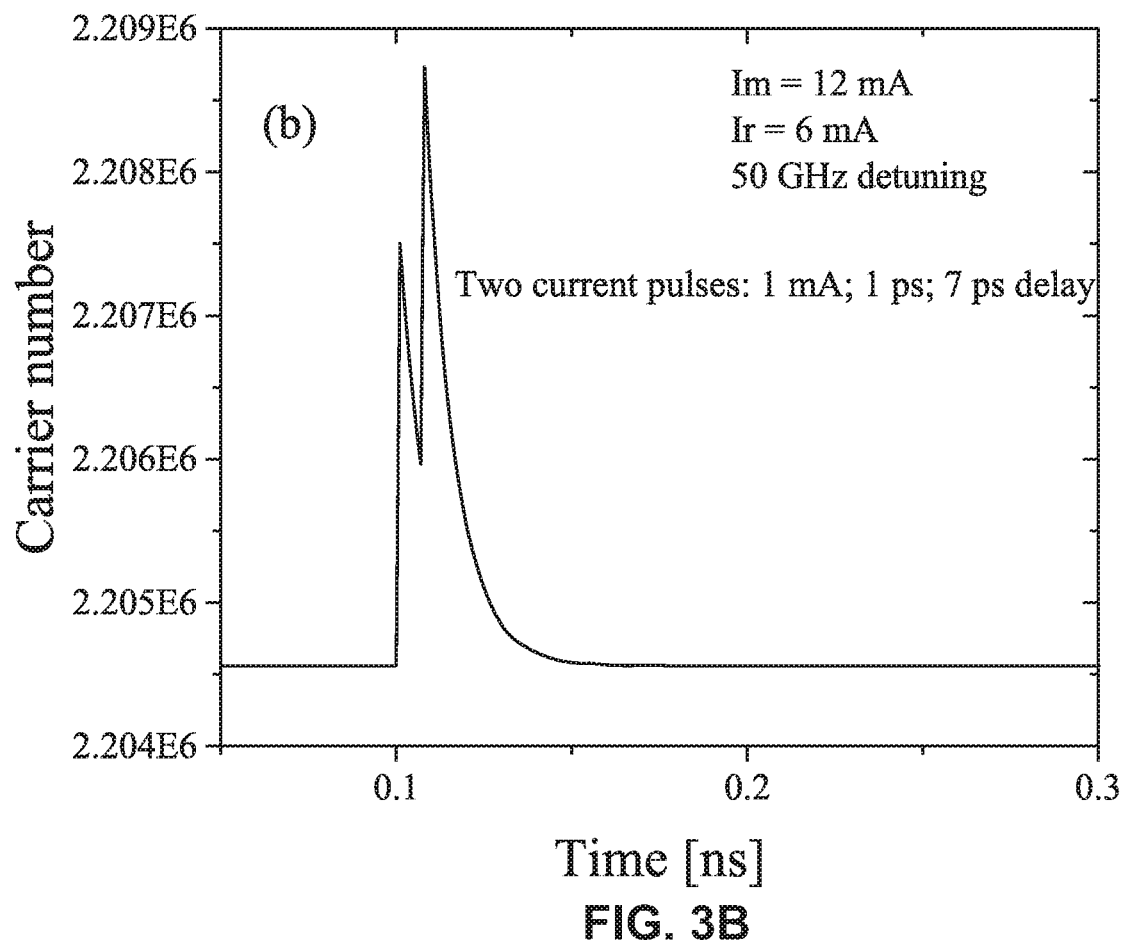
FIG. 3B shows the injected carrier dynamic of an injection-locked WRL to two sequential square 1-ps injection current pulses of 1 mA amplitude having a master laser biased at 12 mA and a ring laser biased at 6 mA with the time delay for the second pulse being 7 ps.
Figure 4A:
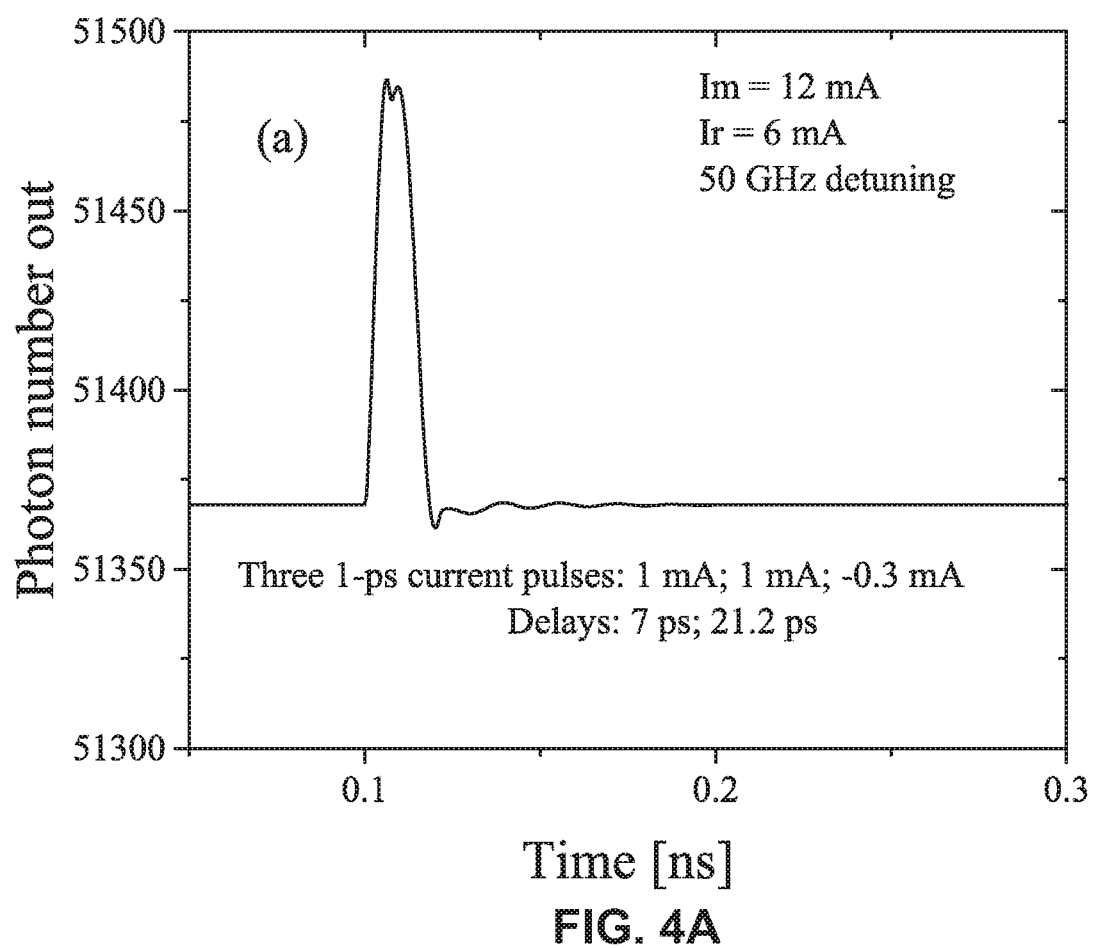
FIG. 4A shows the optical response of an injection-locked WRL to a sequence of three square 1-ps injection current pulses—two positive pulses of 1 mA amplitude and one negative pulse of 0.3 mA amplitude having a master laser biased at 12 mA and a ring laser biased at 6 mA with the time delays being 7 ps for the second pulse and 21.2 ps for the third pulse.
Figure 4B:
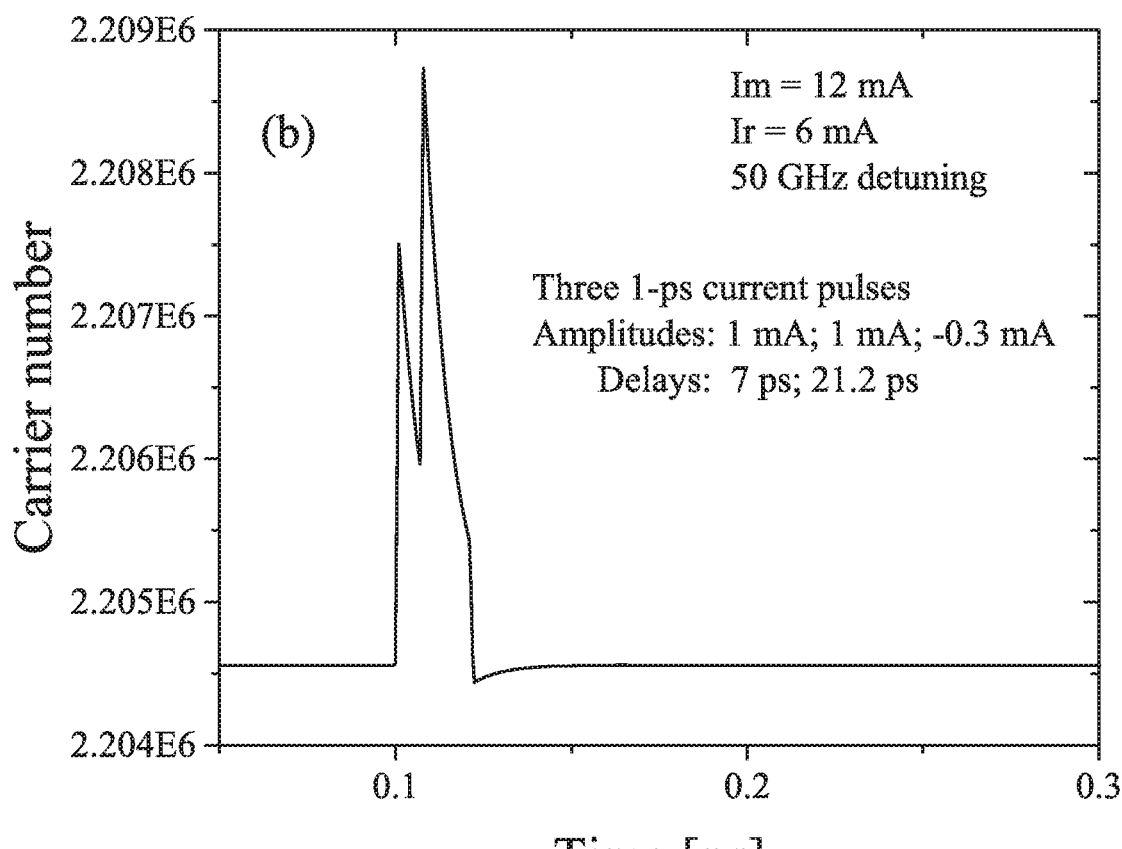
FIG. 4B shows the injected carrier dynamic of an injection-locked WRL to a sequence of three square 1-ps injection current pulses—two positive pulses of 1 mA amplitude and one negative pulse of 0.3 mA amplitude having a master laser biased at 12 mA and a ring laser biased at 6 mA with the time delays being 7 ps for the second pulse and 21.2 ps for the third pulse.
Figure 5:
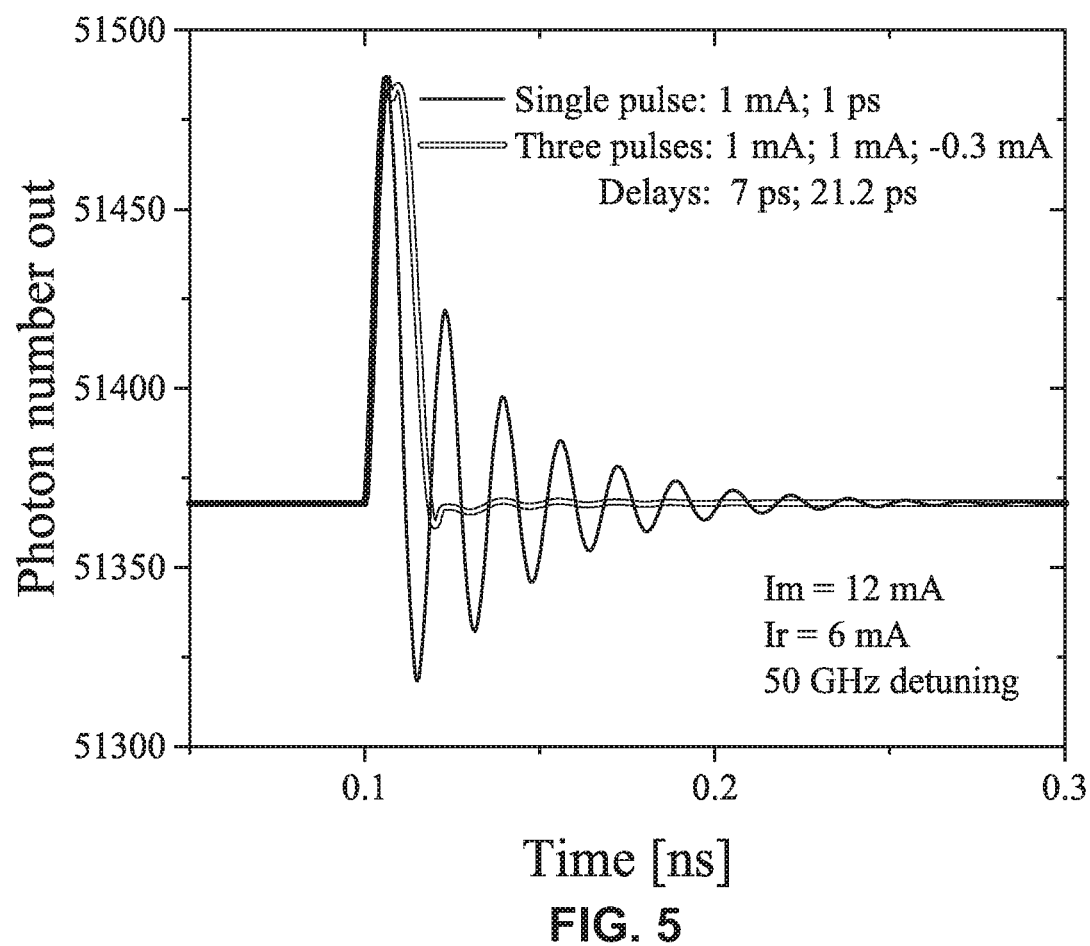
FIG. 5 illustrates a the calculated optical response of the injection-locked WRL to a sequence of three square 1-ps injection current pulses—two positive pulses of 1 mA amplitude and one negative pulse of 0.3 mA amplitude as compared to the optical response to a single 1-ps injection current pulse of 1 mA amplitude under high bias conditions.

In one approach of relatively long delay, for one embodiment of the present invention, a second current pulse is applied when the optical response to the first current pulse has started to decline after reaching its very first peak in the transient decay process. As compared to the optical response to a single 1-ps current pulse (FIG. 1), this approach results in the enhancement of the first intensity pulsation in terms of its duration (stretching of the pulse with no or little change in the amplitude) and substantially suppresses the transient behavior as shown in FIG. 3. The transient behavior can be further suppressed by applying a third 1-ps current pulse of positive or negative polarity with carefully adjusted amplitude as shown in FIG. 4. For the purpose of comparison, the resultant optical response is shown in FIG. 5 together with the optical response to a single 1-ps injection current pulse.

Figure 6A:
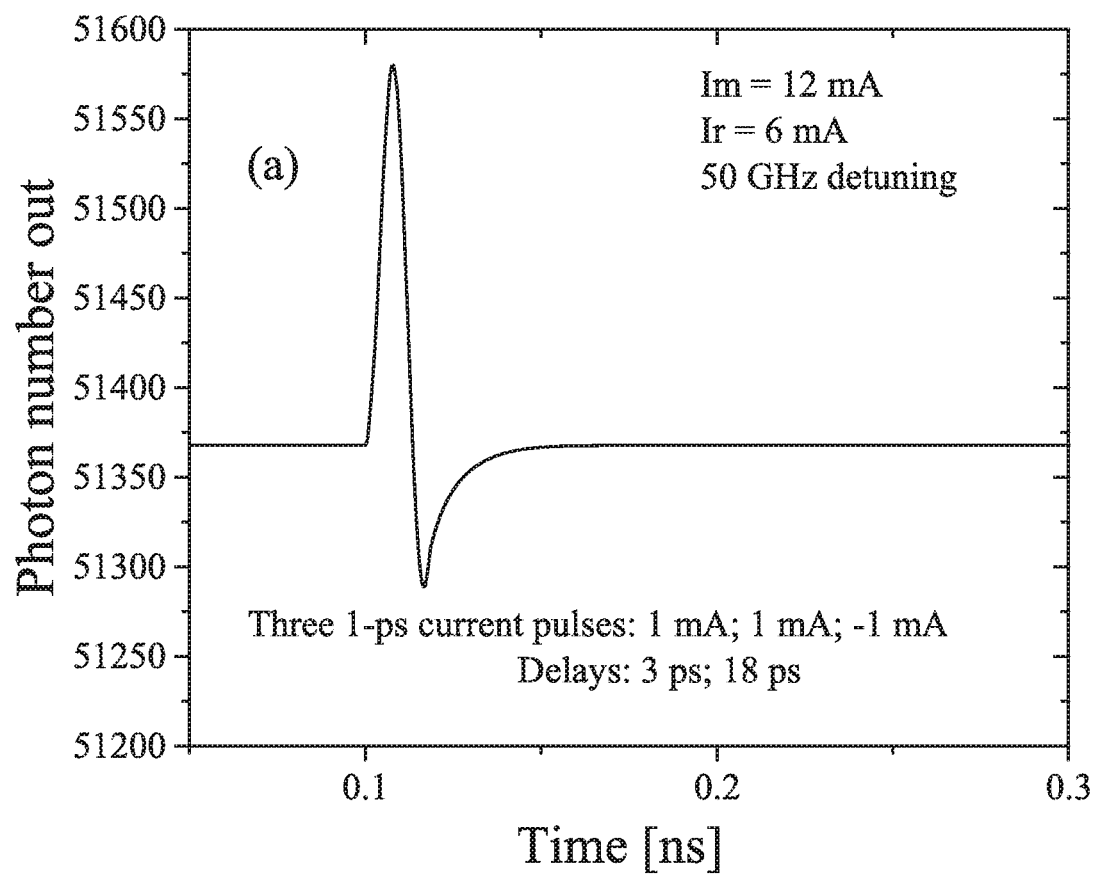
FIG. 6A shows the optical response of an injection-locked WRL to a sequence of two positive and one negative square 1-ps injection current pulses of 1 mA amplitude having a master laser biased at 12 mA and a ring laser biased at 6 mA with the time delays being 3 ps for the second pulse and 18 ps for the third pulse.
Figure 6B:
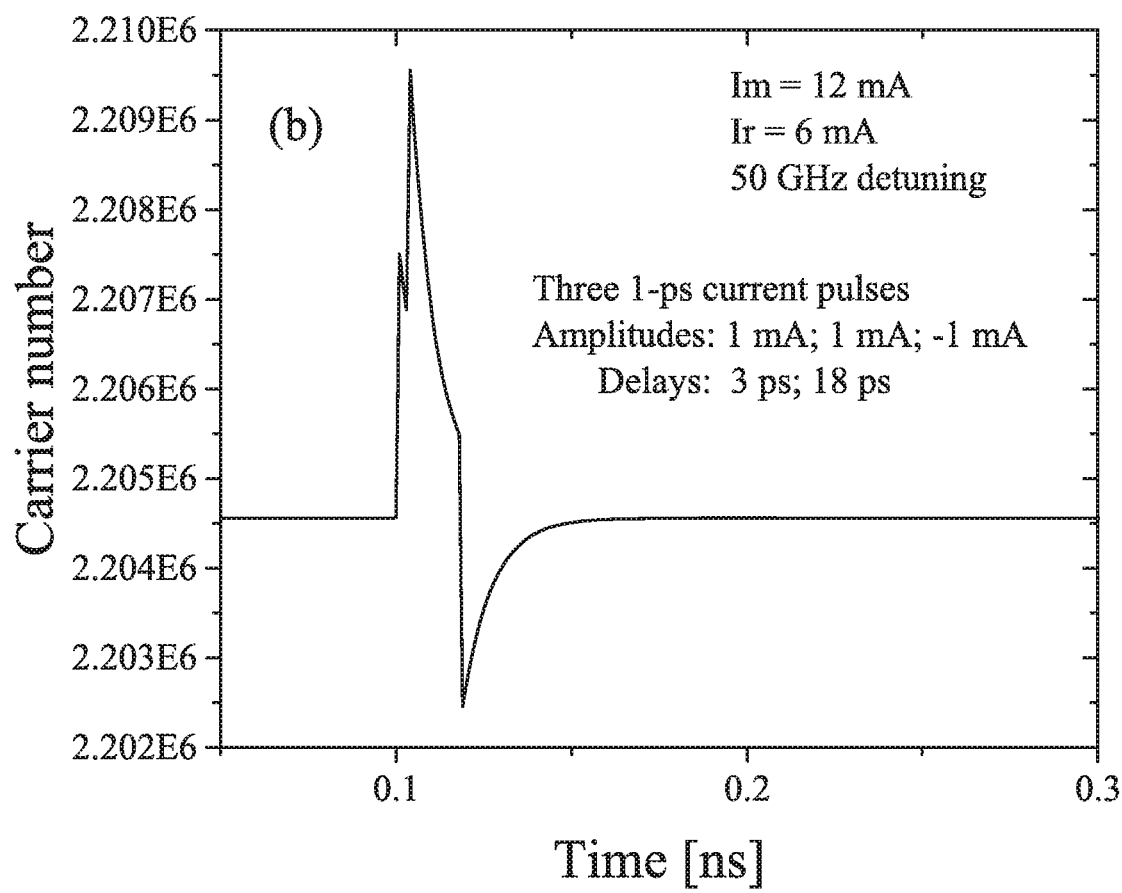
FIG. 6B shows the injected carrier dynamic of an injection-locked WRL to a sequence of two positive and one negative square 1-ps injection current pulses of 1 mA amplitude having a master laser biased at 12 mA and a ring laser biased at 6 mA with the time delays being 3 ps for the second pulse and 18 ps for the third pulse.
Figure 7:
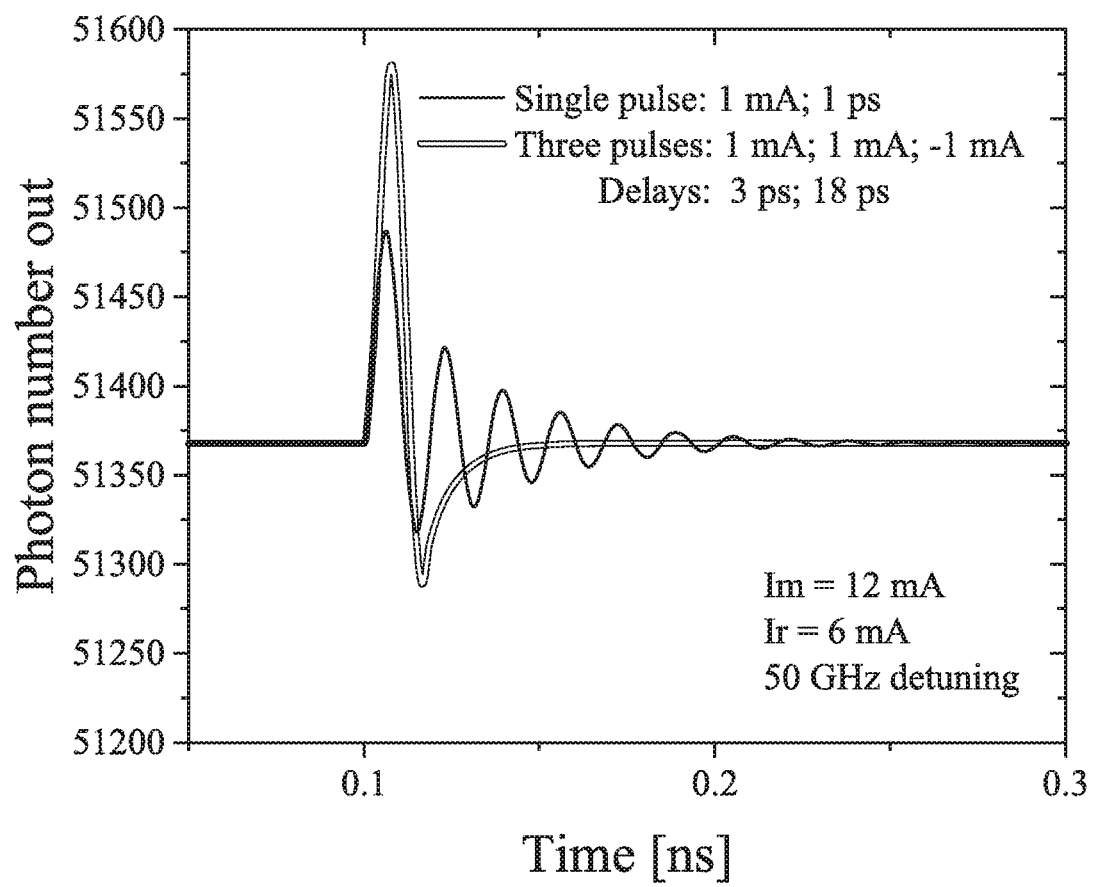
FIG. 7 illustrates the calculated optical response of the injection-locked WRL to a sequence of two positive and one negative square 1-ps injection current pulses of 1 mA amplitude as compared to the optical response to a single 1-ps injection current pulse of 1 mA amplitude under high bias conditions.

In the alternative approach, the second current pulse is applied after a relatively short time delay before the optical response to the first current pulse has reached its very first peak in the transient decay process. As compared to the optical response to a single 1-ps current pulse (FIG. 1), this approach allows for more significant build-up of carriers in the active region and results in the enhancement of the first intensity pulsation in terms of its amplitude (with insignificant change in its duration). As before, the transient behavior can be further suppressed by applying a third 1-ps current pulse of positive or negative polarity with carefully adjusted amplitude as shown in FIG. 6. For the purpose of comparison, the resultant optical response is shown in FIG. 7 together with the optical response to a single 1-ps injection current pulse.

Figure 8A:
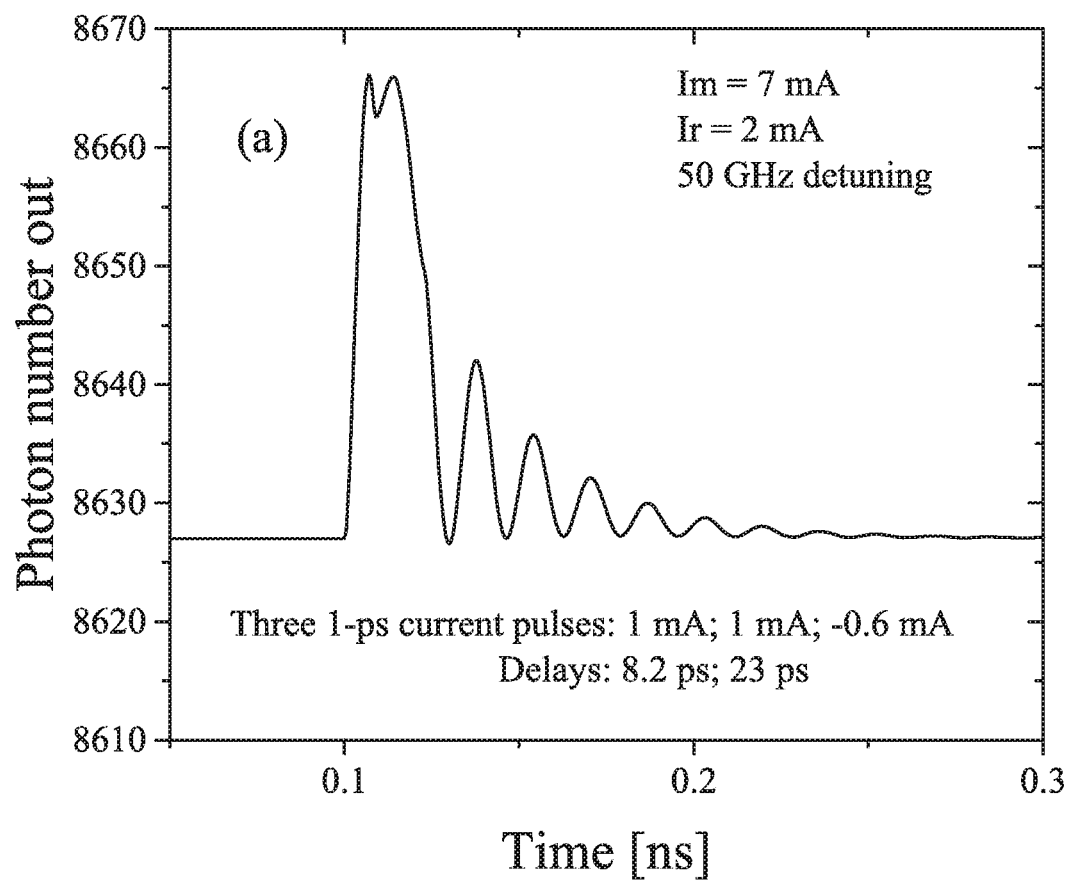
FIG. 8A shows the optical response of an injection-locked WRL to a sequence of three square 1-ps injection current pulses—two positive pulses of 1 mA amplitude and one negative pulse of 0.6 mA amplitude having a master laser biased at 7 mA and a ring laser biased at 2 mA with the time delays being 8.2 ps for the second pulse and 23 ps for the third pulse.
Figure 8B:
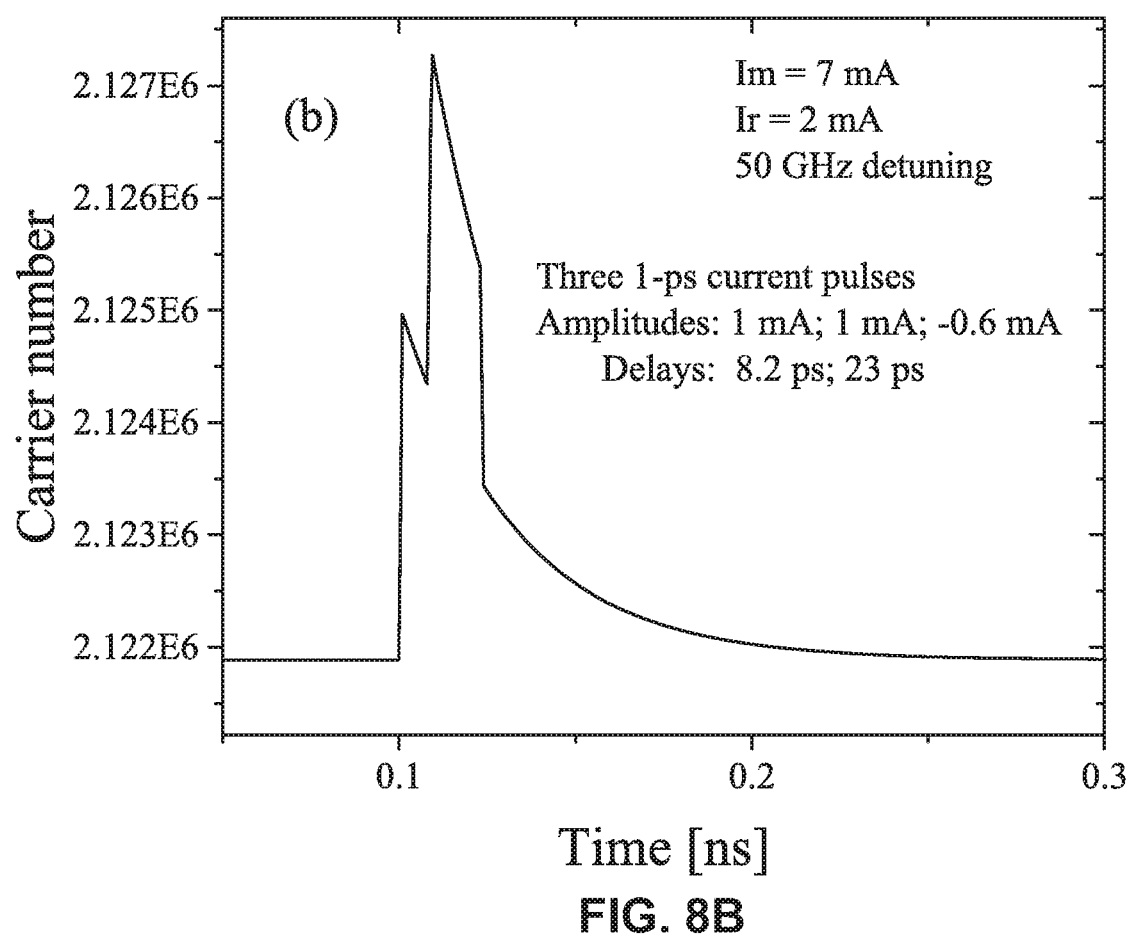
FIG. 8B shows the injected carrier dynamic of an injection-locked WRL to a sequence of three square 1-ps injection current pulses—two positive pulses of 1 mA amplitude and one negative pulse of 0.6 mA amplitude having a master laser biased at 7 mA and a ring laser biased at 2 mA with the time delays being 8.2 ps for the second pulse and 23 ps for the third pulse.
Figure 9:
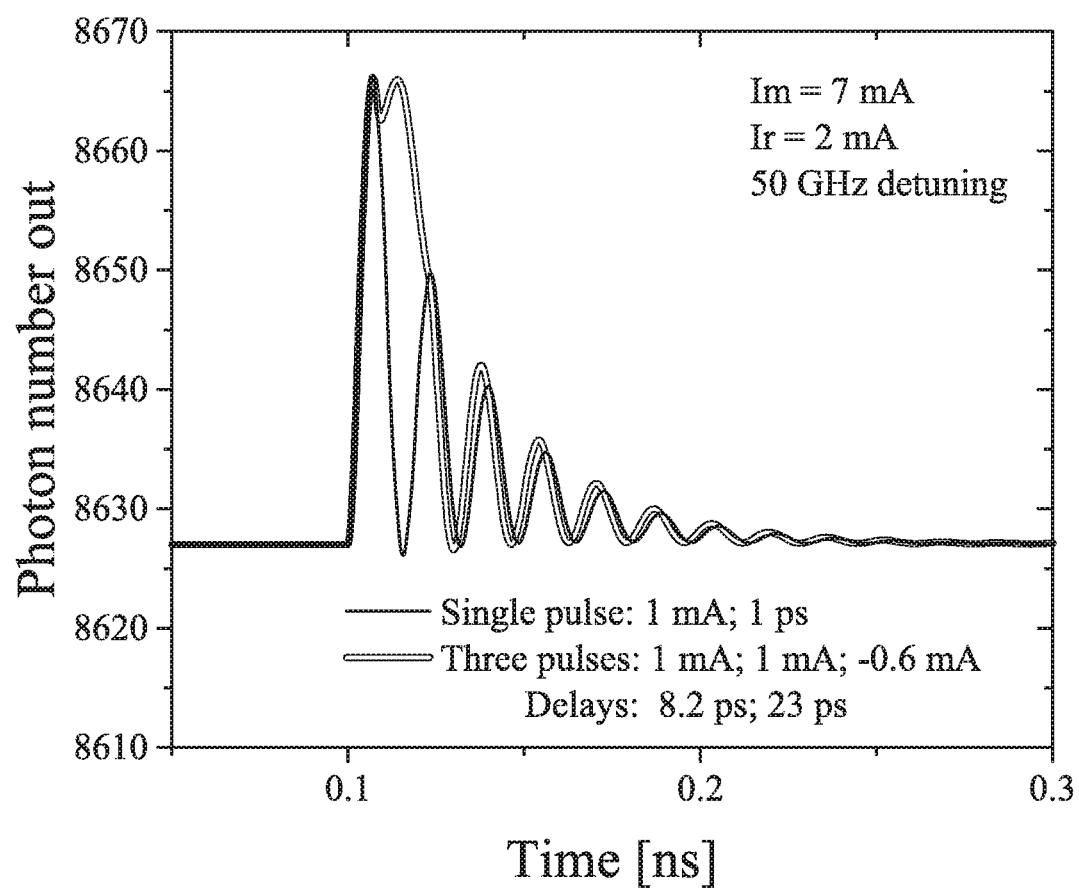
FIG. 9 illustrates the calculated optical response of the injection-locked WRL to a sequence of three square 1-ps injection current pulses—two positive pulses of 1 mA amplitude and one negative pulse of 0.6 mA amplitude as compared to the optical response to a single 1-ps injection current pulse of 1 mA amplitude. Low bias conditions.
Figure 10A:
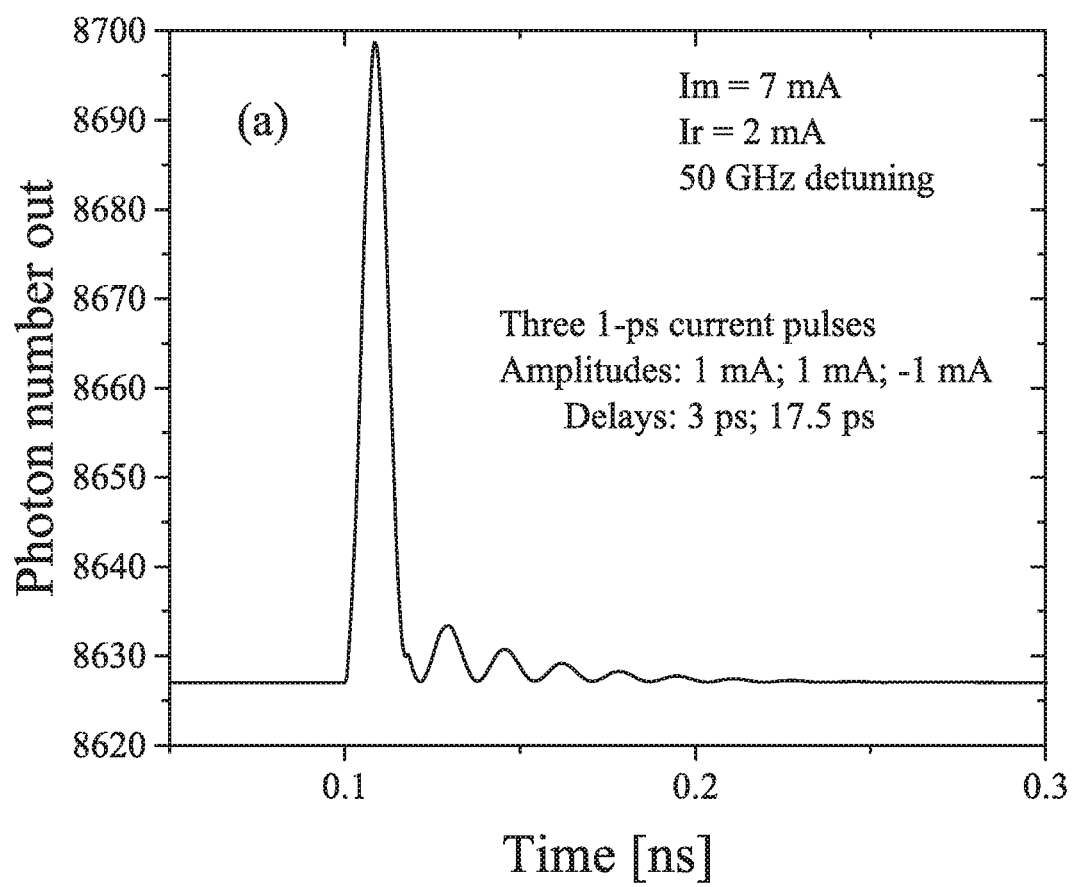
FIG. 10A shows the optical response of an injection-locked WRL to a sequence of two positive and one negative square 1-ps injection current pulses of 1 mA amplitude having a master laser biased at 12 mA and a ring laser biased at 6 mA with the time delays being 3 ps for the second pulse and 17.5 ps for the third pulse.
Figure 10B:
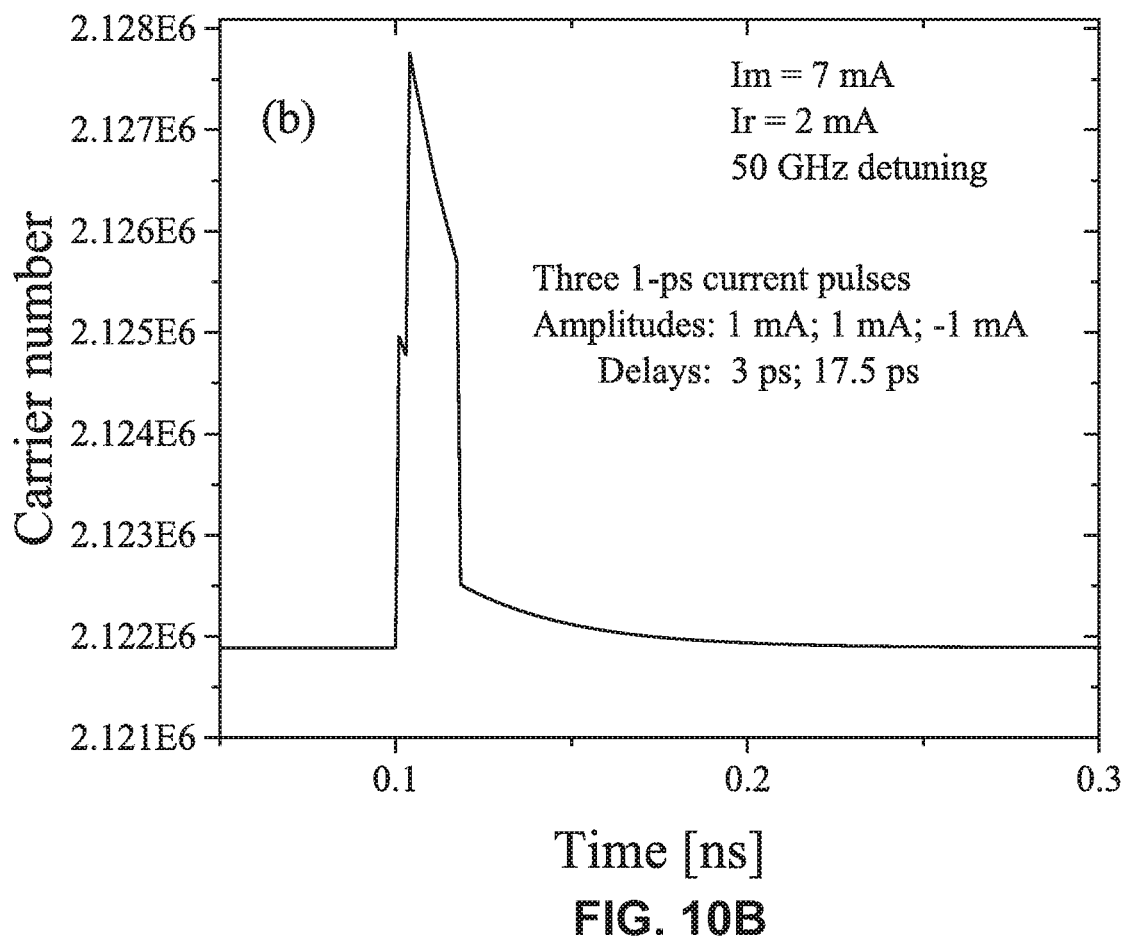
FIG. 10B shows the injected carrier dynamic of an injection-locked WRL to a sequence of two positive and one negative square 1-ps injection current pulses of 1 mA amplitude having a master laser biased at 12 mA and a ring laser biased at 6 mA with the time delays being 3 ps for the second pulse and 17.5 ps for the third pulse.
Figure 11:
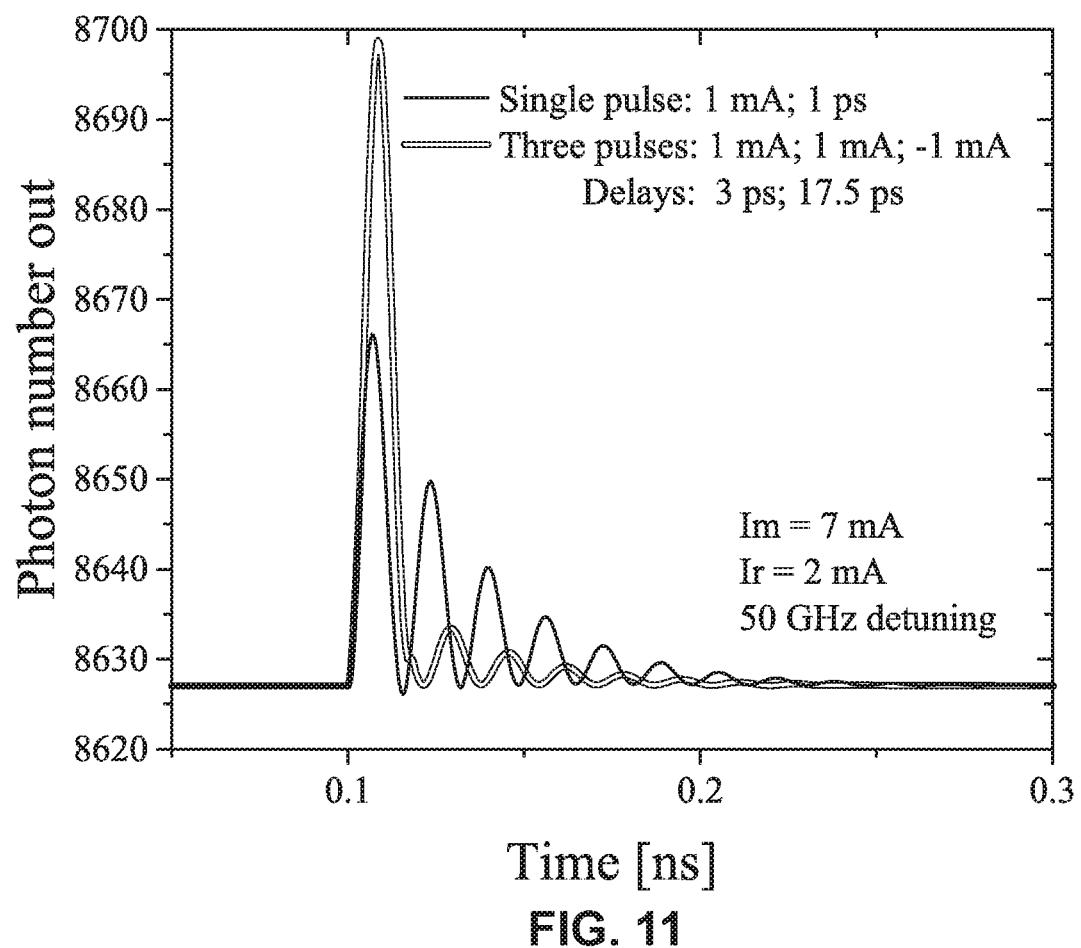
FIG. 11 illustrates the calculated optical response of the injection-locked WRL to a sequence of two positive and one negative square 1-ps injection current pulses of 1 mA amplitude as compared to the optical response to a single 1-ps injection current pulse of 1 mA amplitude under low bias conditions.

With the WRL biased at threshold, the first approach (stretching the optical pulse) seems to be less efficient in suppressing the transient behavior of the optical response to a sequence of 1-ps injection current pulses as shown in FIGS. 8 and 9. The alternative approach (amplifying the amplitude of the optical pulse), is more efficient under low-bias conditions as shown in FIGS. 10 and 11) in shaping the optical output signal with minimum distortion (compare with FIG. 7).

Figure 12A:
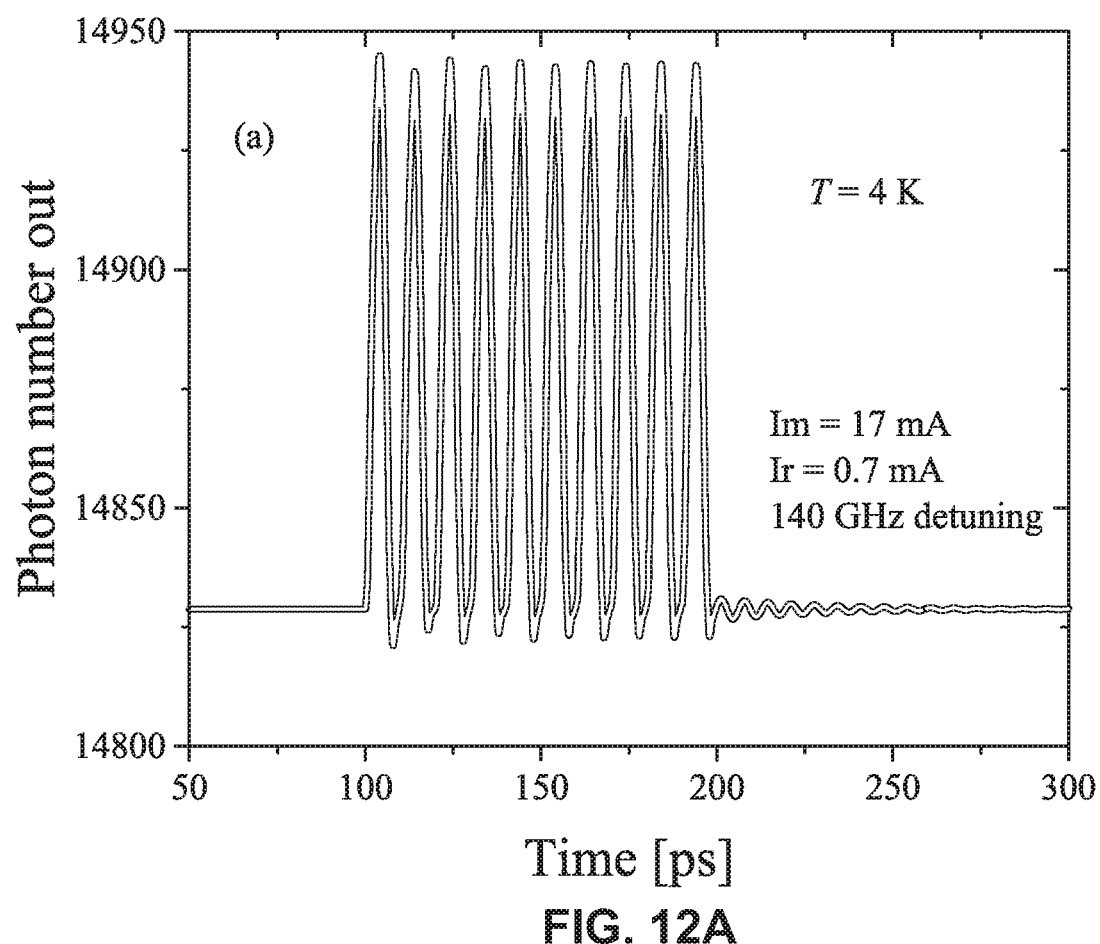
FIG. 12A illustrates the optical response of the injection-locked WRL to a sequence of three square 1-ps bipolar injection current pulses calculated at 4 K as compared to the optical response to a single 1-ps injection current pulse of 1 mA amplitude.
Figure 12B:
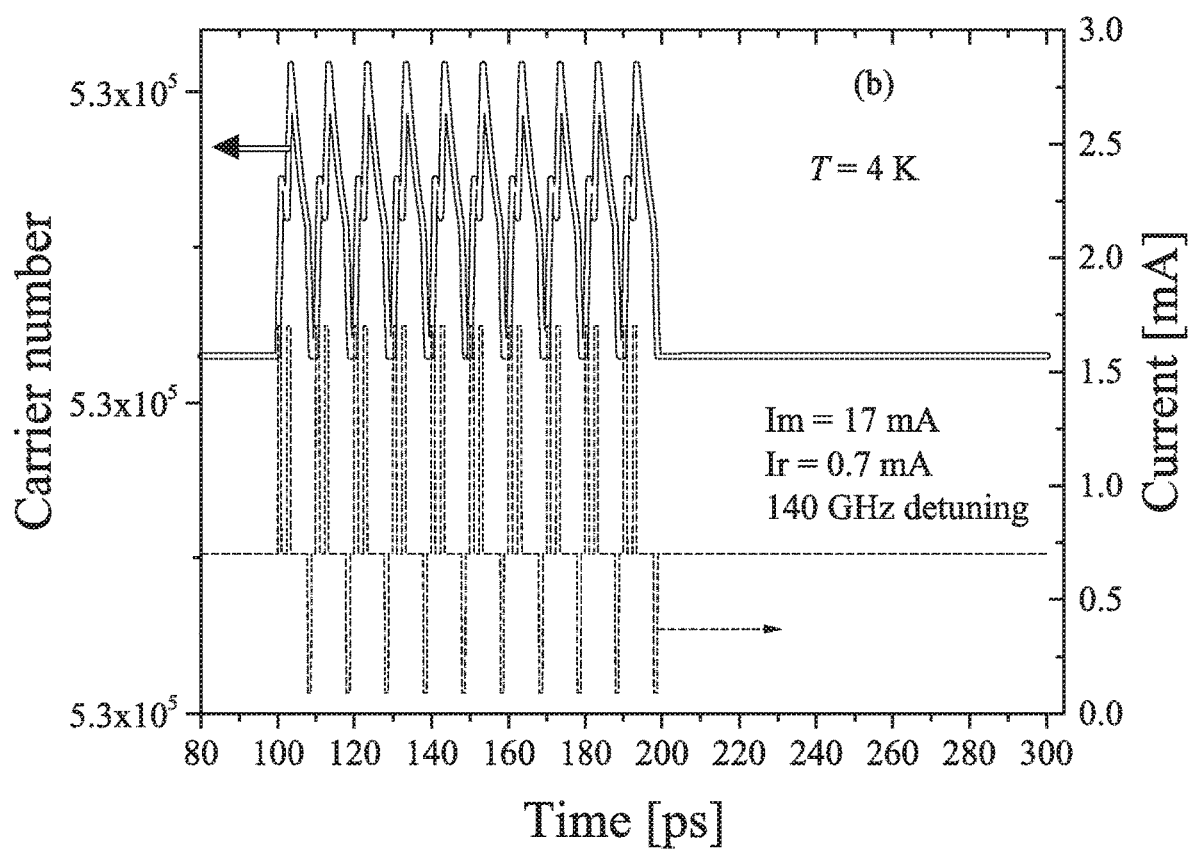
FIG. 12B illustrates the optical response of the injection-locked WRL to a sequence of three square 1-ps bipolar injection current pulses calculated at 4 K showing the time sequence of the applied three 1-ps bipolar injection current pulses: two positive pulses of 1 mA amplitude followed by one negative pulse of 0.61 mA amplitude.

Semiconductor laser operation at cryogenic temperatures provides additional advantages of dramatically reduced threshold injection current, increased internal quantum efficiency, differential gain, and so on. For injection-locked lasers, in particular, all this results in a wider stable injection-locking range, as compared to their room-temperature operation, which translates into a faster and stronger modulation response under comparable laser biasing conditions. FIG. 12 illustrates a fast optical response of the injection-locked WRL at 4 K. The ring laser is biased at 0.6 mA above threshold and the master DBR laser is biased at 11 mA above its threshold. An external master DBR laser, located outside the cryogenic chamber and operated at room temperature, was assumed for the calculations.

Figure 13A:
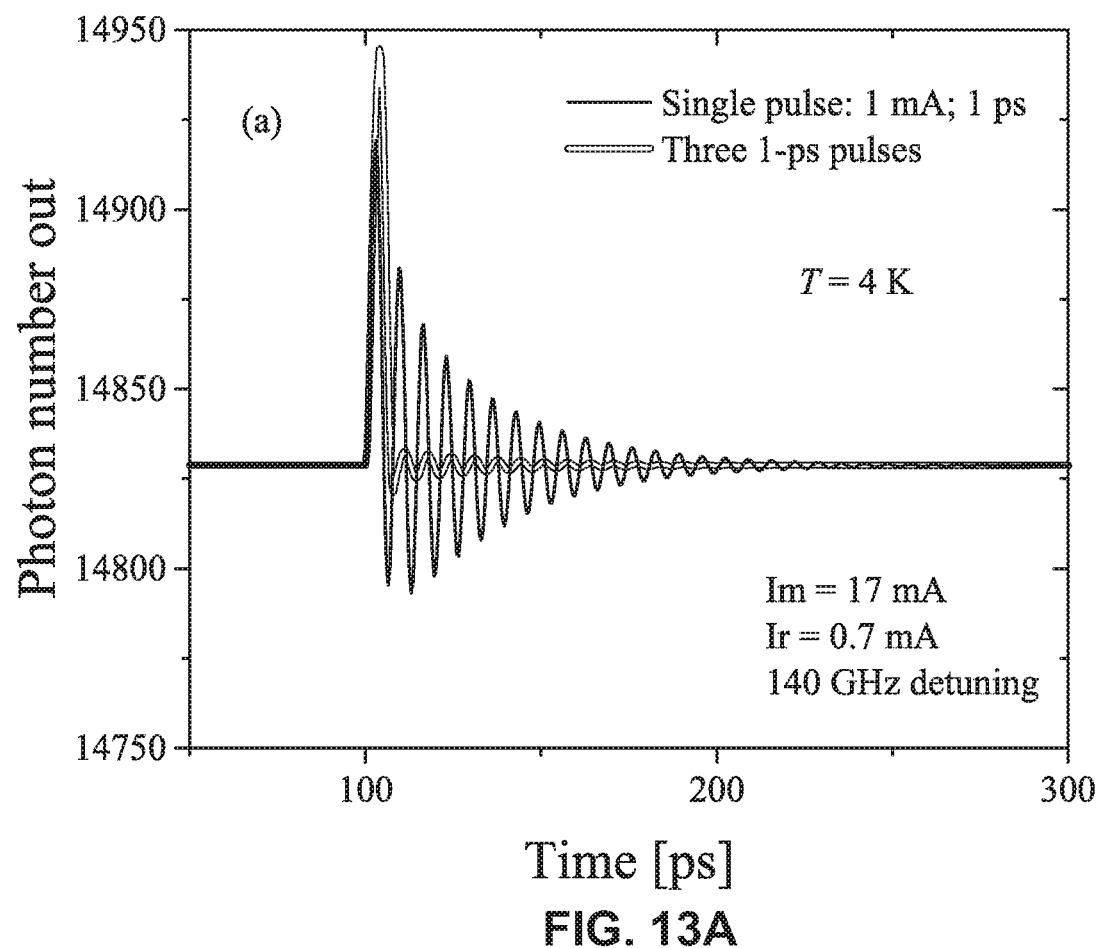
FIG. 13A shows the optical response of an injection-locked WRL having a sequence of ten consecutive "one" bits, each bit represented by three square 1-ps bipolar injection current pulses—two positive pulses of 1 mA amplitude followed by one negative pulse of 0.61 mA amplitude where each bit remains confined to a 10-ps time window, corresponding to 100 GHz modulation rate.
Figure 13B:
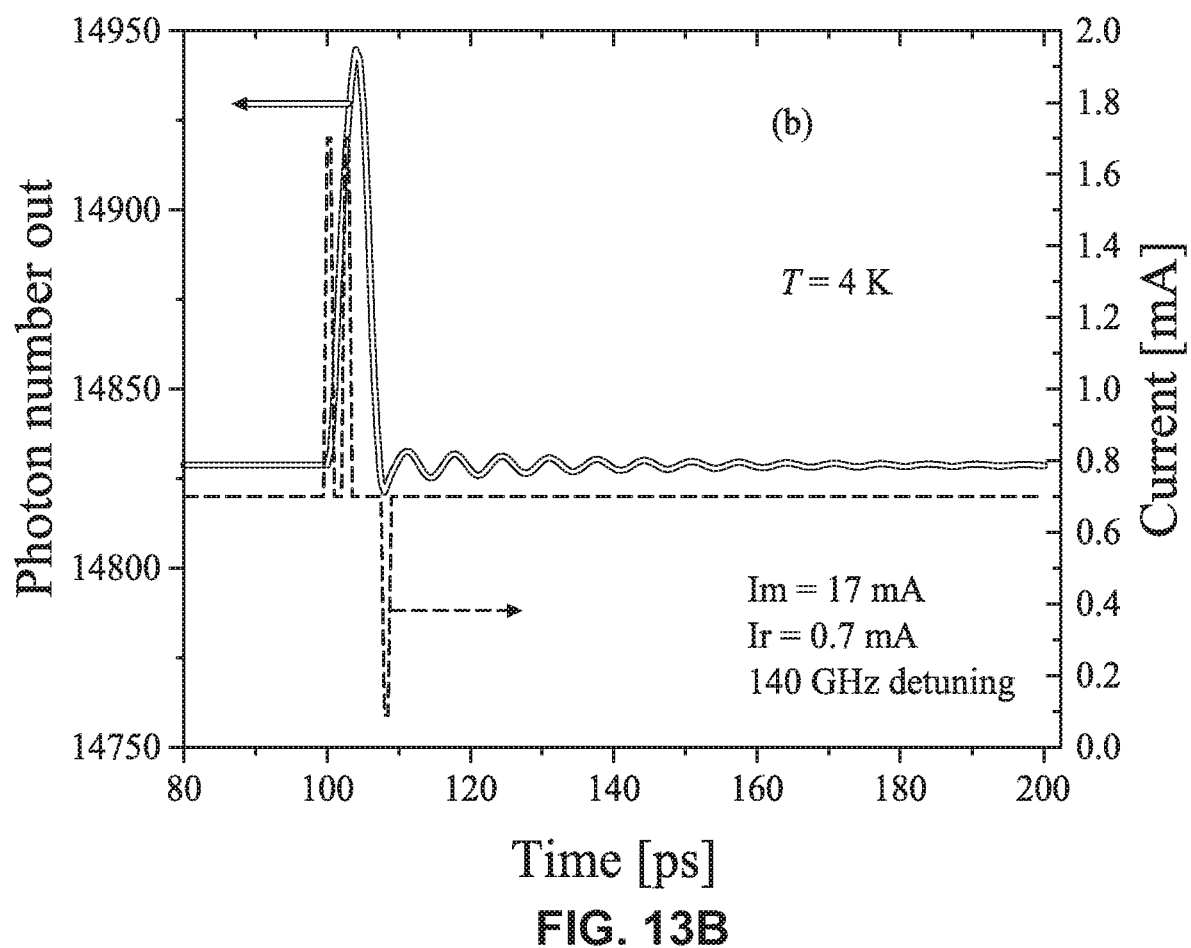
FIG. 13B shows how applied injected current pulses and injected carrier dynamics of an injection-locked WRL having a sequence of ten consecutive "one" bits, each bit represented by three square 1-ps bipolar injection current pulses—two positive pulses of 1 mA amplitude followed by one negative pulse of 0.61 mA amplitude where each bit remains confined to a 10-ps time window, corresponding to 100 GHz modulation rate.

FIG. 13 shows a simulated data transmission at 100 GHz rate through a cryogenic optical data link based on a strongly injection-locked WRL driven by superconducting digital logic signals. The calculated optical response of a strongly injection-locked WRL, modulated by a RSFQ signal, represents a transmitted sequence of ten "one" bits, each bit generated by a group of three square 1-ps injection current pulses with properly adjusted amplitude, polarity, and timing.

Figure 14A:
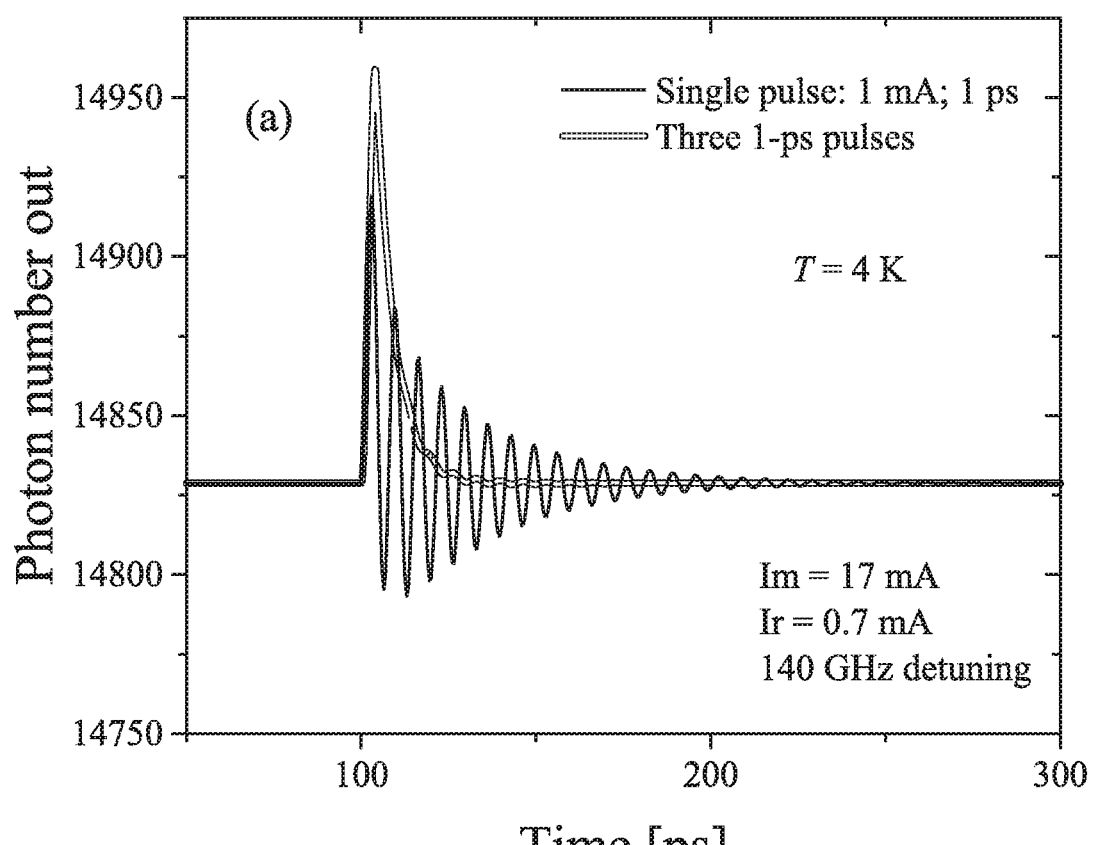
FIG. 14A illustrates the optical response of the injection-locked WRL to a sequence of three square 1-ps positive injection current pulses calculated at 4 K as compared to the optical response to a single 1-ps injection current pulse of 1 mA amplitude.
Figure 14B:
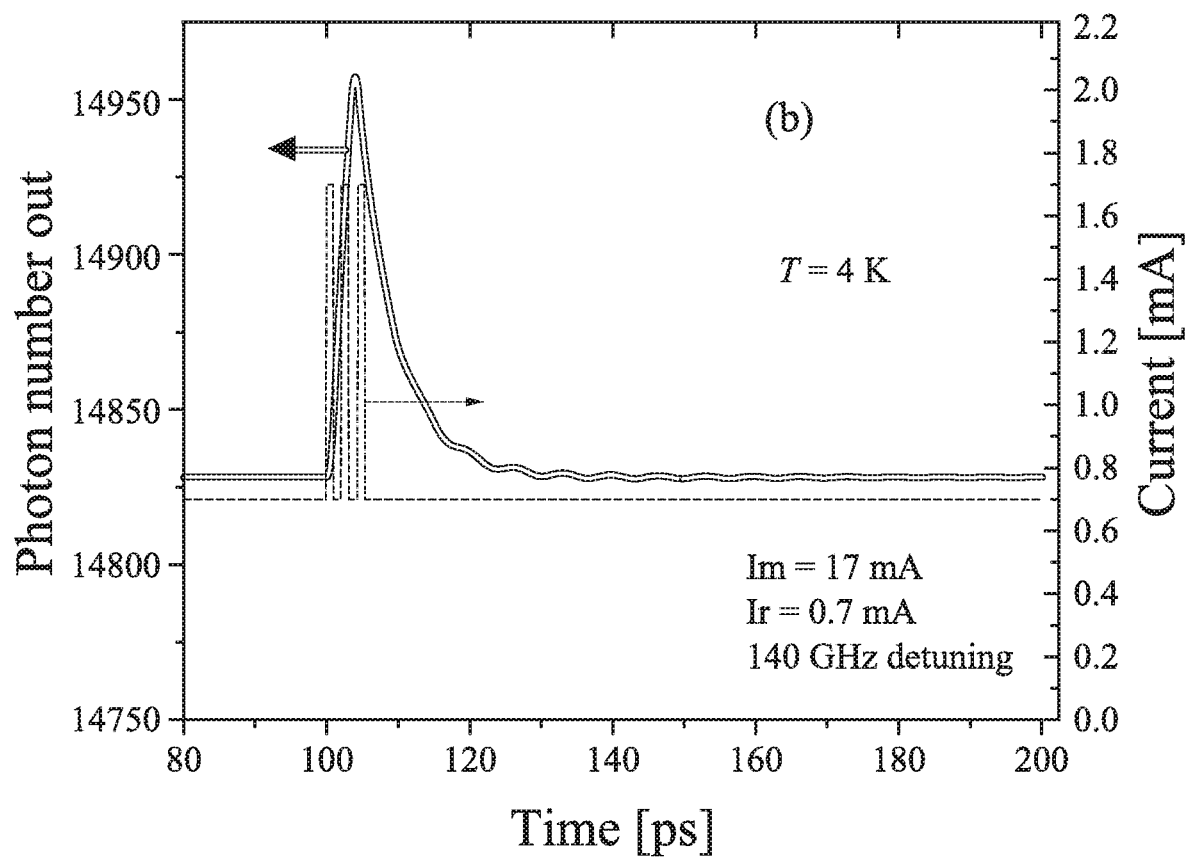
FIG. 14B illustrates the optical response of the injection-locked WRL to a sequence of three square 1-ps positive injection current pulses calculated at 4 K showing the time sequence of the applied three 1-ps positive injection current pulses of 1 mA amplitude.

Similar results can be achieved by employing all positive injection current pulses. FIG. 14 illustrates a fast optical response of the injection-locked WRL at 4 K to a sequence of three square 1-ps positive injection current pulses.

Figure 15A:
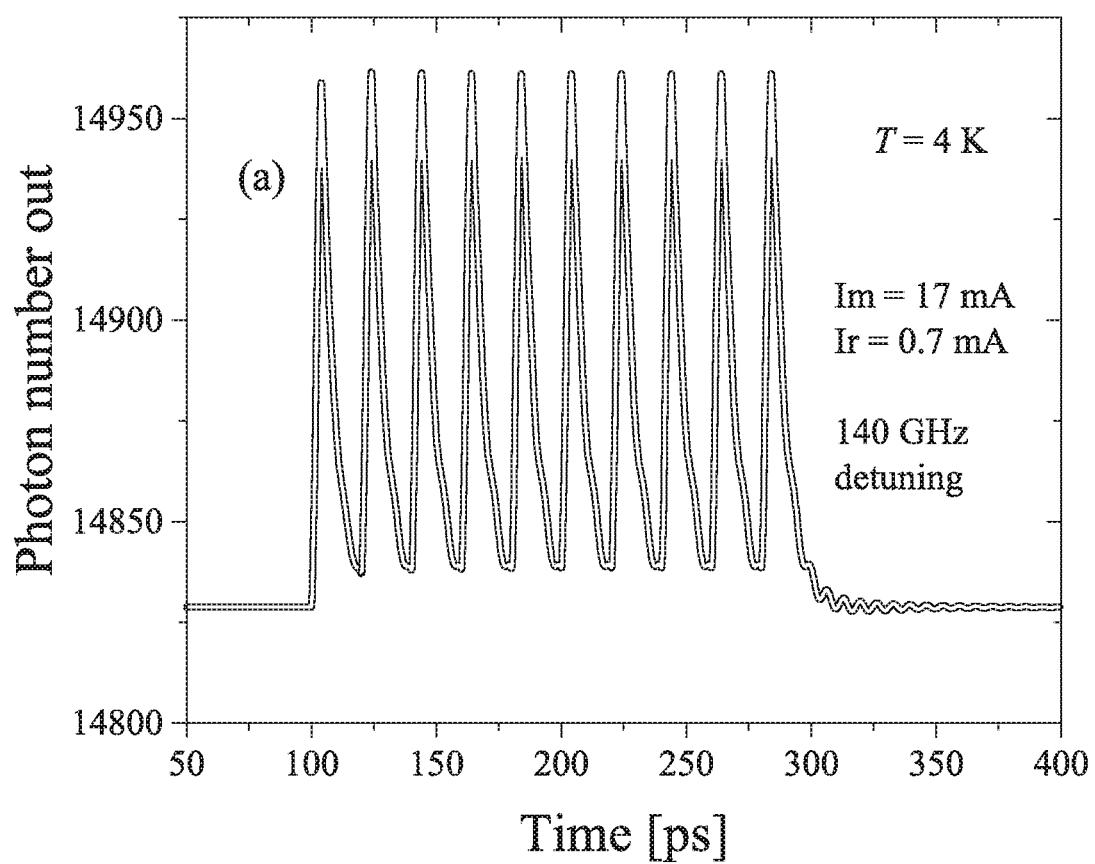
FIG. 15A shows the optical response of an injection-locked WRL having a sequence of ten consecutive "one" bits, each bit represented by three square 1-ps positive injection current pulses of 1 mA amplitude where each bit remains confined to a 20-ps time window, corresponding to 50 GHz modulation rate.
Figure 15B:
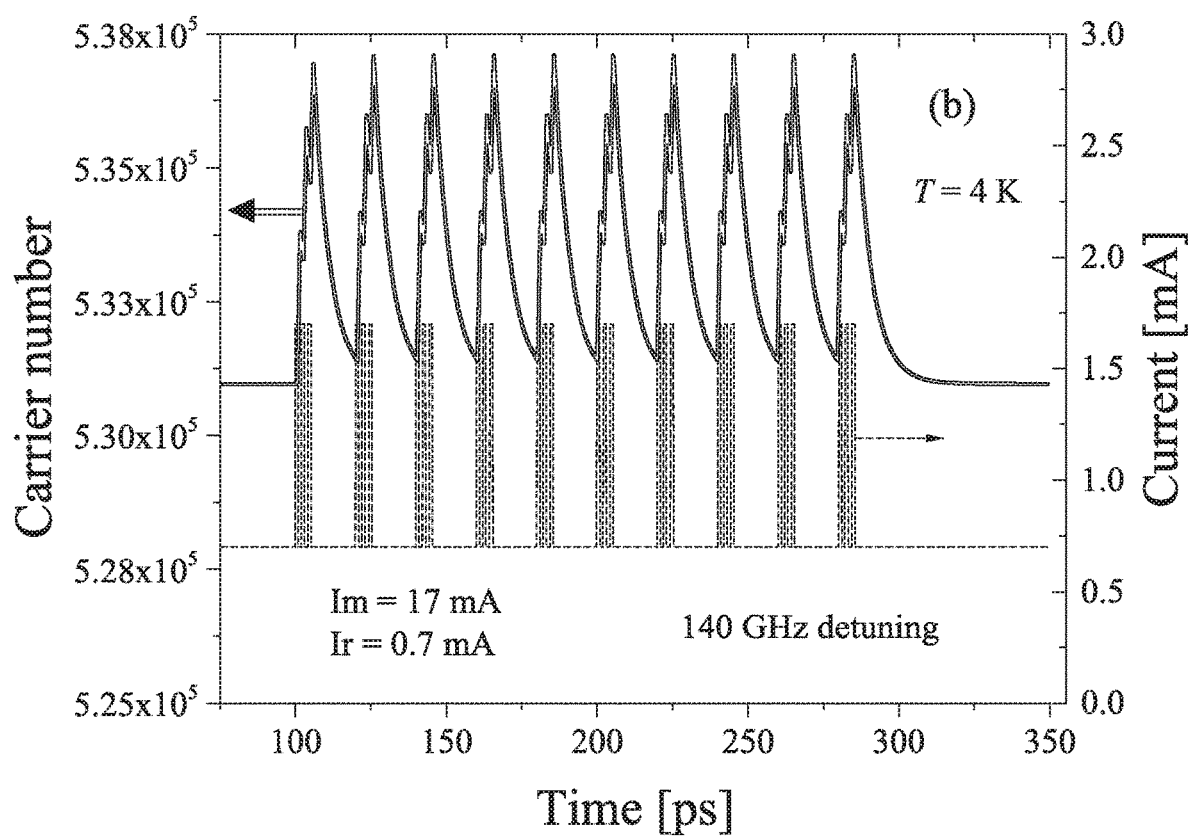
FIG. 15B shows how applied injected current pulses and injected carrier dynamics of an injection-locked WRL having a sequence of ten consecutive "one" bits, each bit represented by three square 1-ps positive injection current pulses of 1 mA amplitude where each bit remains confined to a 20-ps time window, corresponding to 50 GHz modulation rate.
Figure 16:
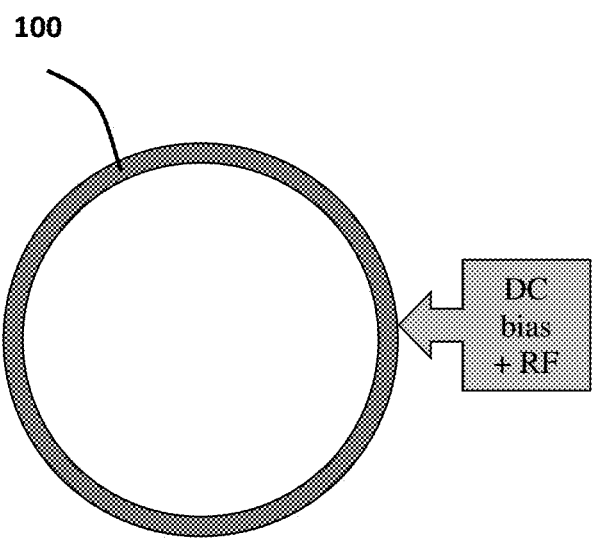
FIG. 16 shows a schematic illustration of a ring semiconductor diode laser 100.
Figure 17:
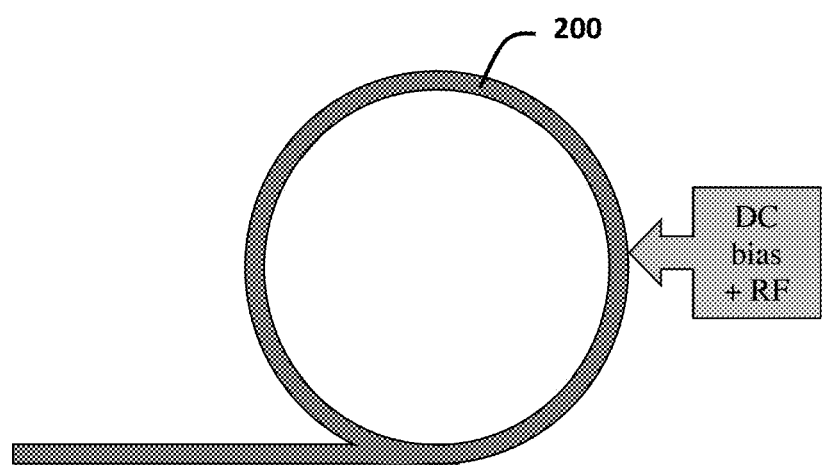
FIG. 17 shows a schematic illustration of a whistle-geometry ring diode laser 200.
Figure 18:
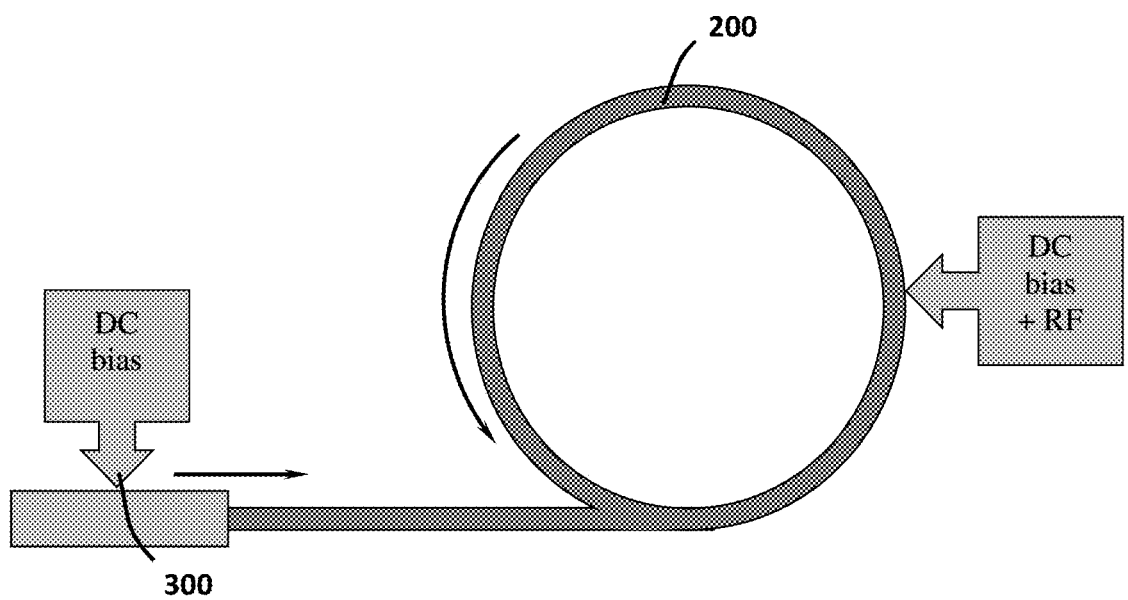
FIG. 18 shows a schematic illustration of a strongly injection-locked whistle-geometry ring diode laser, where the light of the master semiconductor diode laser 300 is injected into a slave whistle-geometry ring diode laser 200.

FIG. 15 shows a simulated data transmission at 50 GHz rate through a cryogenic optical data link based on a strongly injection-locked WRL driven by superconducting digital logic signals. The calculated optical response of a strongly injection-locked WRL, modulated by a RSFQ signal, represents a transmitted sequence of ten "one" bits, each bit generated by a group of three square 1-ps positive injection current pulses with properly adjusted amplitude and timing.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiments, methods, and examples, but by all embodiments and methods within the scope and spirit of the disclosure.

What is claimed is:

1. A method for generating single optical pulses of picosecond-range duration with suppressed transient emission tails in response to applying unipolar or bipolar injection-current pulses of picosecond-range duration to a semiconductor diode laser comprising: generating a sequence of picosecond-range unipolar or bipolar current pulses and applying said sequence of current pulses to a pre-biased semiconductor diode laser so that a first positive injection current pulse enables the semiconductor diode laser to generate a single optical output pulse, whereas the closing positive current pulse suppresses generation of a transient emission tail; wherein said semiconductor diode laser is a ring semiconductor diode laser.

2. The method of claim 1, wherein a second positive current pulse is applied after a time delay when the optical response to the first current pulse has started to decline after reaching its first peak in a transient decay process, resulting in enhancement of the first intensity pulsation in terms of its duration by stretching of the optical pulse with no or little change in the amplitude and suppressing transient behavior.

3. The method of claim 1, wherein a second positive current pulse is applied after a time delay before the optical response to said first current pulse has reached its first peak in a transient decay process, allowing for a build-up of carriers in an active region and resulting in enhancement of the first intensity pulsation in terms of its amplitude by amplification of the optical pulse with no or little change in its duration.

4. The method of claim 2, wherein the amplitude of the closing positive or negative injection current pulse and its time delay are adjusted so as to ensure the most effective suppression of the transient emission tail.

5. The method of claim 3, wherein the amplitude of the closing positive injection current pulse and its time delay are adjusted to suppress the transient emission tail.

6. The method of claim 2, wherein an additional pulse of positive or negative polarity is applied.

7. The method of claim 3, wherein an additional pulse of positive or negative polarity is applied.

8. The method claim 1, wherein said ring diode laser is a whistle-geometry ring diode laser.

9. The method of claim 1, wherein said semiconductor diode laser is strongly injection-locked by a master semiconductor diode laser.

10. The method of claim 1, wherein said semiconductor diode laser is a whistle-geometry ring diode laser and it is strongly injection-locked by a master semiconductor diode laser.

11. A method of operating a semiconductor diode laser comprising the steps of providing a master semiconductor diode laser that controls slave laser dynamics via optical injection in order to generate single picosecond-range optical pulses with suppressed transient emission tails in response to applying injection-current pulses of picosecond-range duration applied to the slave laser.

12. The method of claim 11 wherein said master laser and said slave laser are biased above threshold.

13. The method of claim 11 wherein said master laser is biased above threshold and the slave laser is biased at its threshold.

\* \* \* \* \*